US007510416B2

(12) United States Patent
Sato et al.

(10) Patent No.: US 7,510,416 B2
(45) Date of Patent: Mar. 31, 2009

(54) PIU PLUG-IN/PLUG-OFF MECHANISM FOR ELECTRONIC APPARATUS

(75) Inventors: Yoshiyuki Sato, Kawasaki (JP); Mitsuo Fujimura, Kawasaki (JP); Hideo Araki, Kawasaki (JP); Hideki Zenitani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/889,440

(22) Filed: Aug. 13, 2007

(65) Prior Publication Data

US 2008/0045051 A1 Feb. 21, 2008

(30) Foreign Application Priority Data

Aug. 18, 2006 (JP) ............................. 2006-222936

(51) Int. Cl.
*H01R 13/62* (2006.01)
(52) U.S. Cl. ................... 439/160; 439/159; 439/327; 361/754
(58) Field of Classification Search ................ 439/160, 439/159, 157, 327; 361/754, 798
See application file for complete search history.

(56) References Cited

U.S. PATENT DOCUMENTS

| 5,434,752 | A  | * | 7/1995  | Huth et al. ................. 361/798 |
| 5,793,614 | A  | * | 8/1998  | Tollbom ..................... 361/732 |
| 6,113,402 | A  | * | 9/2000  | Joo ............................ 439/157 |
| 6,185,106 | B1 | * | 2/2001  | Mueller ...................... 361/798 |
| 6,587,350 | B1 | * | 7/2003  | Lin et al. .................... 361/754 |
| 6,944,029 | B1 | * | 9/2005  | Marcolina et al. ........... 361/754 |
| 7,070,431 | B1 | * | 7/2006  | White ........................ 439/160 |
| 7,292,457 | B2 | * | 11/2007 | DeNies et al. .............. 361/801 |

FOREIGN PATENT DOCUMENTS

JP 2000-091772 3/2000

* cited by examiner

*Primary Examiner*—Hien Vu
(74) *Attorney, Agent, or Firm*—Staas & Halsey LLP

(57) ABSTRACT

A PIU plug-in/plug-off mechanism for an electronic apparatus, which is capable of efficiently applying a force required for a plugging-in/off operation of connectors to a printed board by pressing a portion of the printed board close to a backplane. An operating handle of a card lever is turned counterclockwise to thereby bring a push pin into abutment with a rear edge of an open recess. When the card lever is further turned in this state, a pressing force for moving a plug-in unit in the insertion direction acts on an engaging member via an arm. This starts fitting the printed board into a plug-in connector without causing warping of the printed board.

9 Claims, 29 Drawing Sheets

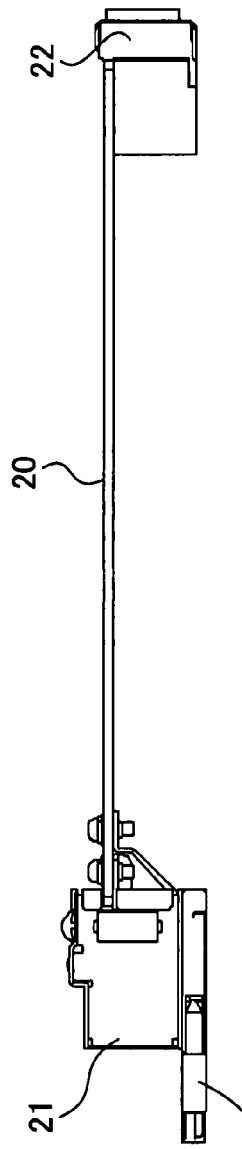
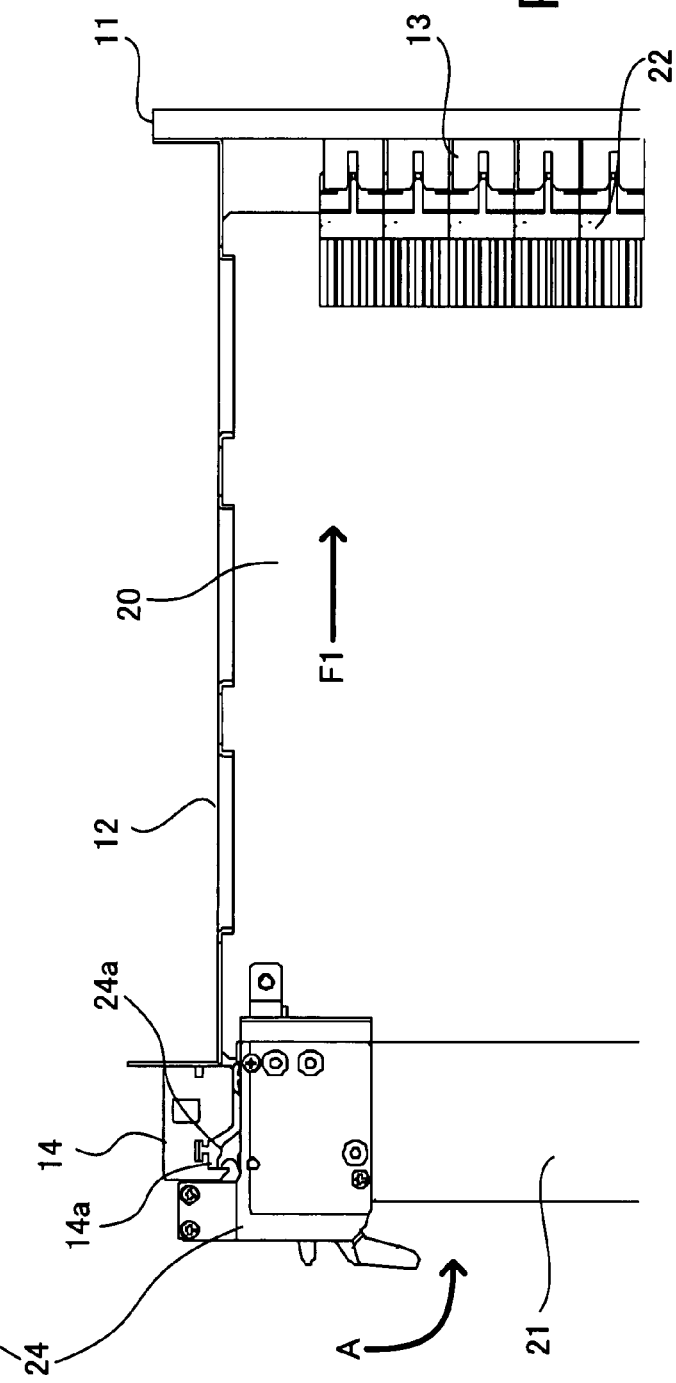
FIG. 20A PRIOR ART
FIG. 20B PRIOR ART

PIU PLUG-IN/PLUG-OFF MECHANISM FOR ELECTRONIC APPARATUS

CROSS-REFERENCE TO RELATED APPLICATIONS

This application is based upon and claims the benefits of priority from the prior Japanese Patent Application No. 2006-222936, filed on Aug. 18, 2006, the entire contents of which are incorporated herein by reference.

BACKGROUND OF THE INVENTION

1. Field of the Invention

This invention relates to a PIU (plug-in unit) plug-in/plug-off mechanism for an electronic apparatus, which enables the printed board of a PIU to be plugged into and out of a bookshelf-type electronic apparatus, and more particularly to a PIU plug-in/plug-off mechanism for an electronic apparatus, which is configured not to prevent electronic components of a plug-in unit from being damaged when the printed board of the plug-in unit is plugged into and out of the backplane of the electronic apparatus.

2. Description of the Related Art

In a conventional bookshelf-type electronic apparatus, when the printed board of a plug-in unit is plugged into/out of a backplane of the electronic apparatus, a nail of a card lever secured to the front panel of the plug-in unit is engaged with a strike plate disposed on a front face of a shelf body, and a propulsive force generated by turn of the card lever is transmitted to the printed board.

FIG. 19 is a perspective view showing the overall arrangement of a conventional bookshelf-type electronic apparatus having a backplane.

A shelf 10 forms a subrack unit having the backplane 11, disposed on a rear side at a predetermined depth location, as a motherboard. A plug-in unit is plugged into the backplane 11. Within the shelf 10, guide plates each formed with guide rails 12 are disposed with a predetermined space between each vertically associated pair, and plug-in connectors 13 are arranged on the backplane 11. A printed board 20 is inserted into the shelf 10 by having its upper and lower sides guided along the respective guide rails 12 in the shelf 10. Thus, a plurality of plug-in units are in orderly arrangement in the shelf 10.

The printed board 20 has a front panel 21 provided on an operator side thereof, as viewed in the insertion direction, and plug-in connectors 22 and a guide module, not shown, provided on a rear side thereof, as viewed in the insertion direction. The plug-in connectors 22 of the printed board 20 are accurately positioned by the guide module and are connected to the plug-in connectors 13 on the backplane 11. In the front face of the shelf 10, strike plates 14 and 15 are formed on the respective upper and lower guide plates each formed with the guide rails 12. On the other hand, guide levers 24 and 25 are disposed at respective upper and lower ends of the front panel 21 of the printed board 20.

FIG. 20A is a plan view of a conventional printed board. FIG. 20B is a side view of essential parts of the printed board connected to the backplane.

The strike plate 14 is formed with a recessed part 14a for engagement with a nail part 24a of a card lever 24. When the card lever 24 is turned in a direction indicated by an arrow A, a force F1 acts on the printed board 20 in the insertion direction. This provides a force pushing the plug-in connector 22 toward the backplane 11 to thereby apply a necessary fitting force to the printed board 20 being inserted in the shelf 10.

In the conventional PIU plug-in/plug-off mechanism constructed as above, when the printed board 20 is plugged into the plug-in connectors 13 on the backplane 11, the card levers 24 and 25 are pushed in the depth direction and turned until they are pressed against the front panel 21, so as to firmly push the printed board 20 into the plug-in connectors 13. However, since insertion forces transmitted from the card levers 24 and 25 to the plug-in connectors 13 on the backplane 11 acts rearward from the front end of the printed board 20, the printed board 20 is sometimes largely bent, which causes a fear that the printed board 20 is broken or electronic components mounted thereon are adversely affected.

FIG. 21 is a perspective view of a printed board assembled as a conventional plug-in unit. FIG. 22 is an exploded perspective view of the conventional plug-in unit.

In an optical transmission device or a like electronic device, optical converter modules 26 and 27, for example, are sometimes mounted on the printed board 20 forming the plug-in unit. The optical converter modules 26 and 27 sometimes have radiation fins 26a and 27a having a predetermined thickness, formed on respective surfaces thereof. In such a case, after forming large-sized open holes 20a and 20b in the printed board 20, the optical converter modules 26 and 27 are fixed to the printed board 20 using module-mounting screws 28 and 29.

FIG. 23 is a three-view diagram showing the front surface, the top, and a side of the conventional plug-in unit. FIG. 24 is a diagram showing the rear surface of the conventional plug-in unit.

The plug-in unit as shown in these figures can realize an optical transmission device provided e.g. with the optical converter modules 26 and 27, by forming the open holes 20a and 20b having a predetermined size, in the printed board 20. What is more, the plug-in unit is advantageous in that it can be given a degree of freedom of arrangement of components on the printed board 20.

In the conventional PIU plug-in/plug-off mechanism constructed as above, since the open holes 20a and 20b are formed in the printed board 20, the rigidity of the printed board 20 becomes insufficient. On the other hand, pressing forces from the card levers 24 and 25 are transmitted via the printed board 20, which can deform the printed board 20 of the plug-in unit during a plugging-in operation, and in a worse case cause breakage of the printed board 20.

Next, a description will be made of the plugging-in operation of a plug-in unit in a conventional electronic apparatus.

FIGS. 25 to 28 are views useful in explaining the plugging-in operation of the plug-in unit in the conventional electronic apparatus. Hereafter, a turning operation of the card lever 24 disposed at the upper part of the plug-in unit will be mainly described, assuming that the card lever 25 disposed at the lower part of the plug-in unit is turned together with the card lever 24.

FIG. 25 shows a state of the plug-in unit being pressed rightward, as viewed in the figure, and thereby being plugged into the plug-in connector 13 disposed on the backplane 11. At this time, a first nail part 24a of the card lever 24 has been lowered to a position immediately below the recessed part 14a of the strike plate 14, but it has not appeared in the figure. The plug-in connector 22 on the leading end of the printed board 20 is being brought closer to the plug-in connector 13.

Referring to FIG. 26, the card lever 24 is turned counterclockwise, and the first nail part 24a appears from the front panel 21 and comes into abutment with the inner surface of the recessed part 14a of the strike plate 14. That is, the first nail part 24a of the card lever 24 and the recessed part 14a of the strike plate 14 come into engagement with each other.

Referring to FIG. 27, the card lever 24 is further turned counterclockwise, whereby the first nail part 24a presses the recessed part 14a of the strike plate 14. At this time, the card lever 25, not shown in FIG. 27, is turned at the lower part of the plug-in unit just as the card lever 24 is turned at the upper part of the plug-in unit, so that the whole plug-in unit is smoothly moved along the upper and lower guide rails 12 in a direction indicated by an arrow B in FIG. 27, to advance the plug-in connector 22 of the printed board 20 to a position from which the plug-in connector 22 starts to be inserted into the plug-in connector 13.

Referring to FIG. 28, the card lever 24 has been turned and brought into a state where the end thereof is pointed vertically downward, and the plug-in unit has been further moved in the direction indicated by the arrow B by the pressing forces from the card levers 24 and 25. This places the plug-in unit into a state connected to the plug-in connectors 13 on the backplane 11.

In plugging-off the plug-in unit, an operation is carried out which is reverse in its procedure to the above-described procedure of the plugging-in operation of the plug-in unit, and a second nail part 24b of the card lever 24, appearing in FIG. 25, acts on an outer side surface of the strike plate 14.

FIG. 29 is a view useful in explaining problems with the plugging-in operation of the plug-in unit in the conventional electronic apparatus.

FIG. 29 provides a comparison between a position where the first nail part 24a comes into abutment with the recessed part 14a of the strike plate 14 in a first stage of the plugging-in operation, shown in FIG. 26, and a position where the first nail part 24a is held in contact with the recessed part 14a of the strike plate 14 in a final stage of the same shown in FIG. 28.

When the card lever 24 is operated to plug in the plug-in unit, the first nail part 24a of the card lever 24 moves in an arc about a rotating shaft 24c, and hence a position of contact between the first nail part 24a and the recessed part 14a, as a stopper, of the strike plate 14 relatively varies, i.e. is not constant. Similarly, when the plug-in unit is plugged off by the second nail part 24b of the card lever 24, a strong pressing force is generated which acts between the card lever 24 and the outer side surface, as a stopper, of the strike plate 14, and hence the second nail part 24b moves while causing friction.

In the conventional PIU plug-in/plug-off mechanism configured as above, when plug-in/plug-off levers with high strength are employed, not only a force applied to the plug-in unit of an optical/electronic device, but also forces applied to the backplane 11, the plug-in connectors 13, and the shelf 10 are increased, which can cause breakage of any of these components. To solve this problem, a fitting mechanism has been proposed e.g. in Japanese Unexamined Patent Publication No. 2000-91772 (paragraphs [0014] to [0032] and FIGS. 1 and 2), in which phase differences are provided between operations of movable backboards based on motion curves defined by cam grooves formed in respective cams associated with the movable backboards, and a plurality of sets of connector housings and connector plugs are fitted to each other separately at respective times made different from each other.

As described hereinabove, in the conventional PIU plug-in/plug-off mechanism, since the printed board 20 is sometimes largely bent, there is a fear that the printed board 20 is broken or electronic components mounted on the printed board 20 are adversely affected.

Further, when the rigidity of the printed board 20 becomes insufficient, the printed board 20 of the plug-in unit can be deformed during a plugging-in operation, which can lead to breakage of the printed board 20.

Furthermore, the operating forces of the card levers 24 and 25 are lost due to frictions with the strike plates 14 and 15, and hence in a plug-in unit provided with high-speed and high-density connectors, it is impossible to efficiently obtain a force required for a connector plugging-in operation. In addition, actions of the card levers 24 and 25 during a plugging-off operation of the plug-in unit can damage the front surfaces of the strike plates 14 and 15. Therefore, a testing operation carried out using a plug-in unit on an electronic apparatus as a product before shipment of the electronic apparatus can cause the problem of damaging the product.

SUMMARY OF THE INVENTION

The present invention has been made in view of the above points, and an object thereof is to provide a PIU plug-in/plug-off mechanism for an electronic apparatus, which presses a portion of a printed board close to a backplane to thereby efficiently apply a force required for a connector plug-in/plugging-off operation.

To attain the above object, there is provided a PIU plug-in/plug-off mechanism for an electronic apparatus, which enables a printed board to be plugged into and out of a bookshelf-type electronic apparatus. The PIU plug-in/plug-off mechanism of the electronic apparatus comprises a shelf having a backplane on which the printed board is mounted, on a rear side, a card lever that is supported on a front face of the shelf and is turned for plugging in/out the printed board, an arm that has a base part connected to the card lever and a free end formed to extend toward the backplane of the shelf, and an engaging member that is provided at a leading end of the printed board such that the engaging member is engaged with the free end of the arm in a state where the printed board is inserted in the shelf. When the card lever is turned in one direction, the free end of the arm is brought into engagement with the engaging member. When the card lever is further turned, the printed board is pushed toward the backplane within the shelf by the free end of the arm via the engaging member. When the card lever is turned in another direction, the printed board is pushed away from the backplane within the shelf by the free end of the arm via the engaging member.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 20A is a plan view of a printed board to be received in the conventional electronic apparatus.

FIG. 20B is a side view of essential parts of the printed board connected to the backplane.

DESCRIPTION OF THE PREFERRED EMBODIMENTS

The present invention will now be described in detail with reference to the accompanying drawings showing preferred embodiments thereof applied to a PIU plug-in/plug-off mechanism.

First Embodiment

Figure 1:
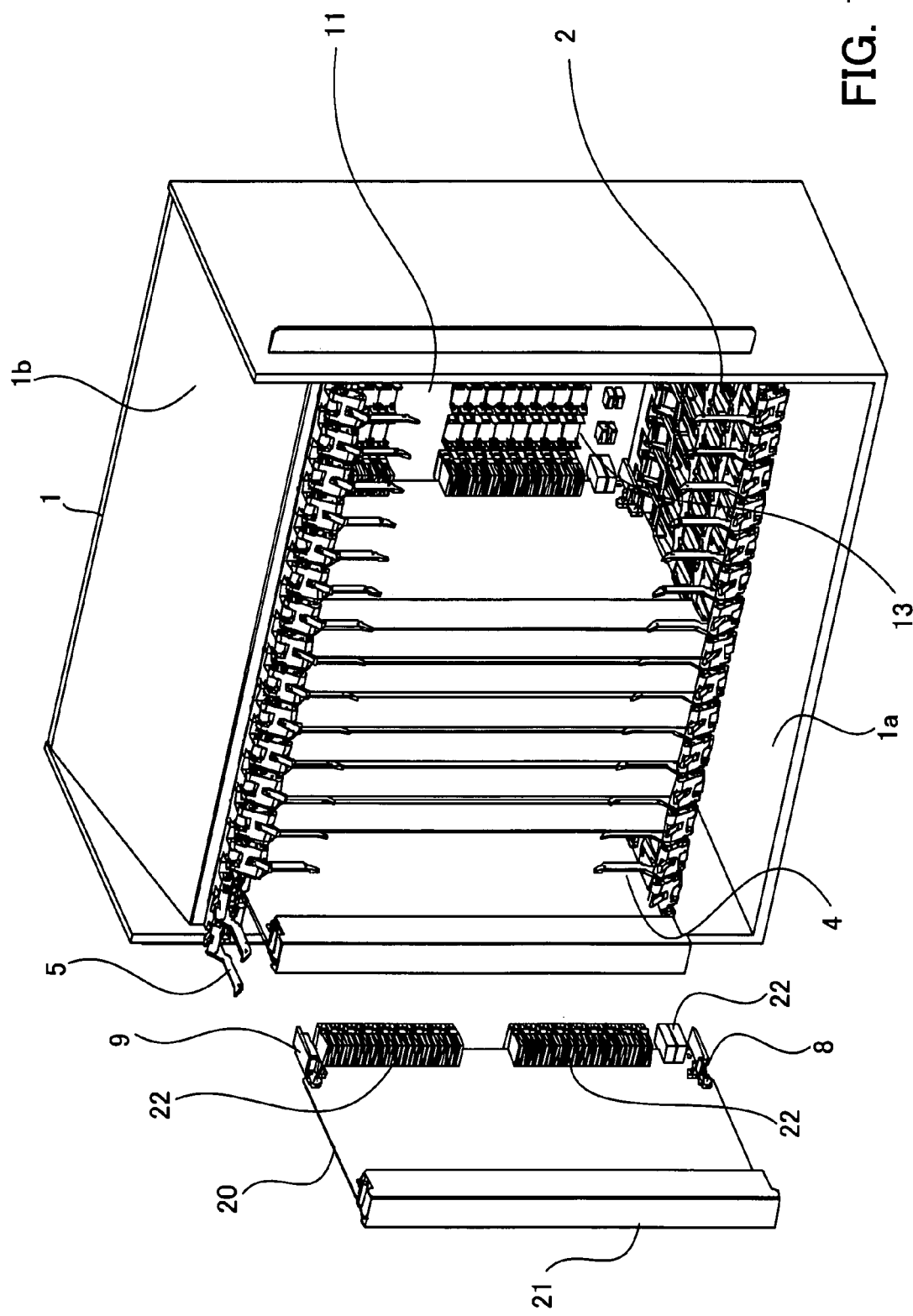
FIG. 1 is a perspective view showing the overall arrangement of a bookshelf-type electronic apparatus according to the present invention.
Figure 2:
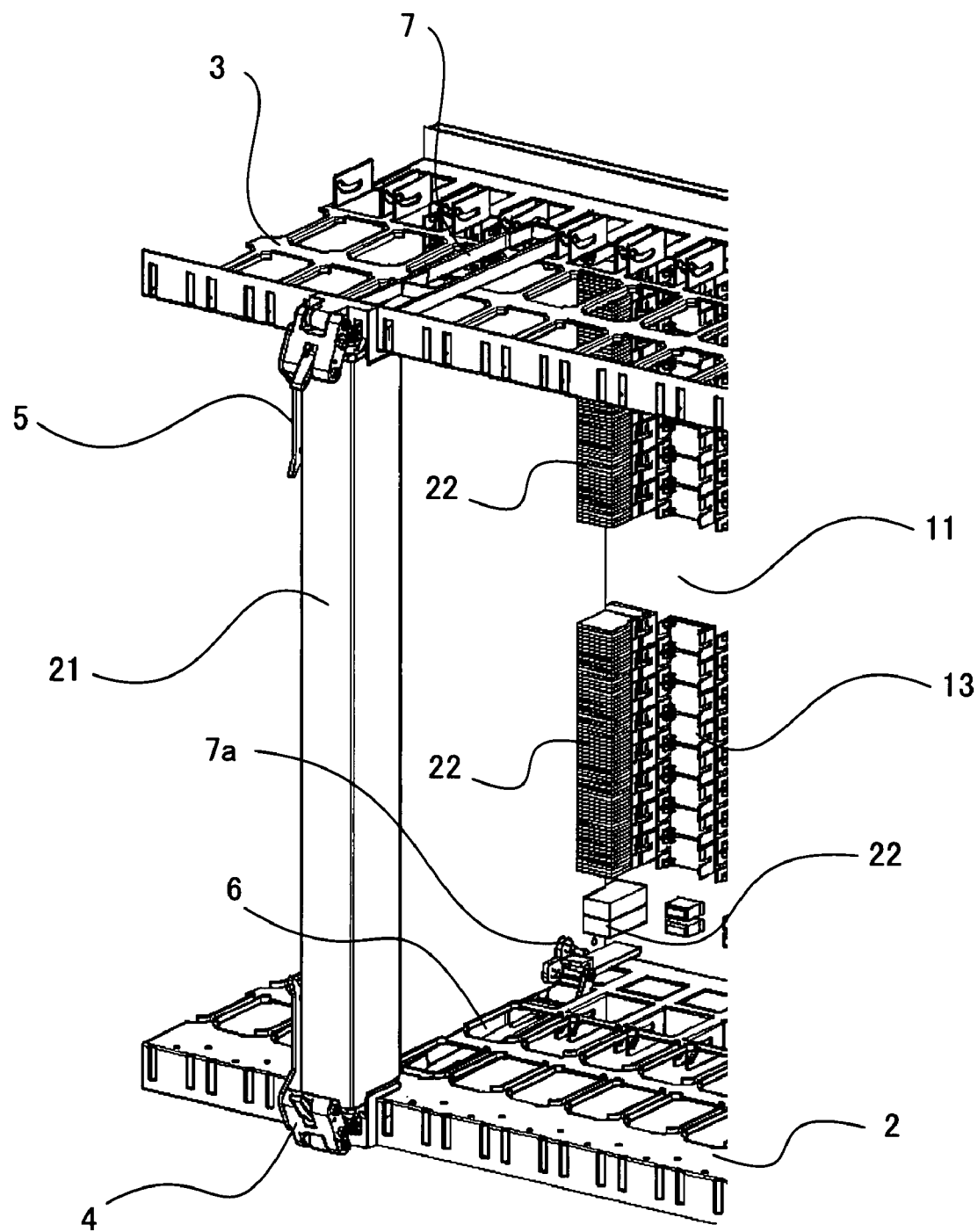
FIG. 2 is a partial explanatory view of the electronic apparatus with a plug-in unit connected to a backplane thereof.
Figure 19:
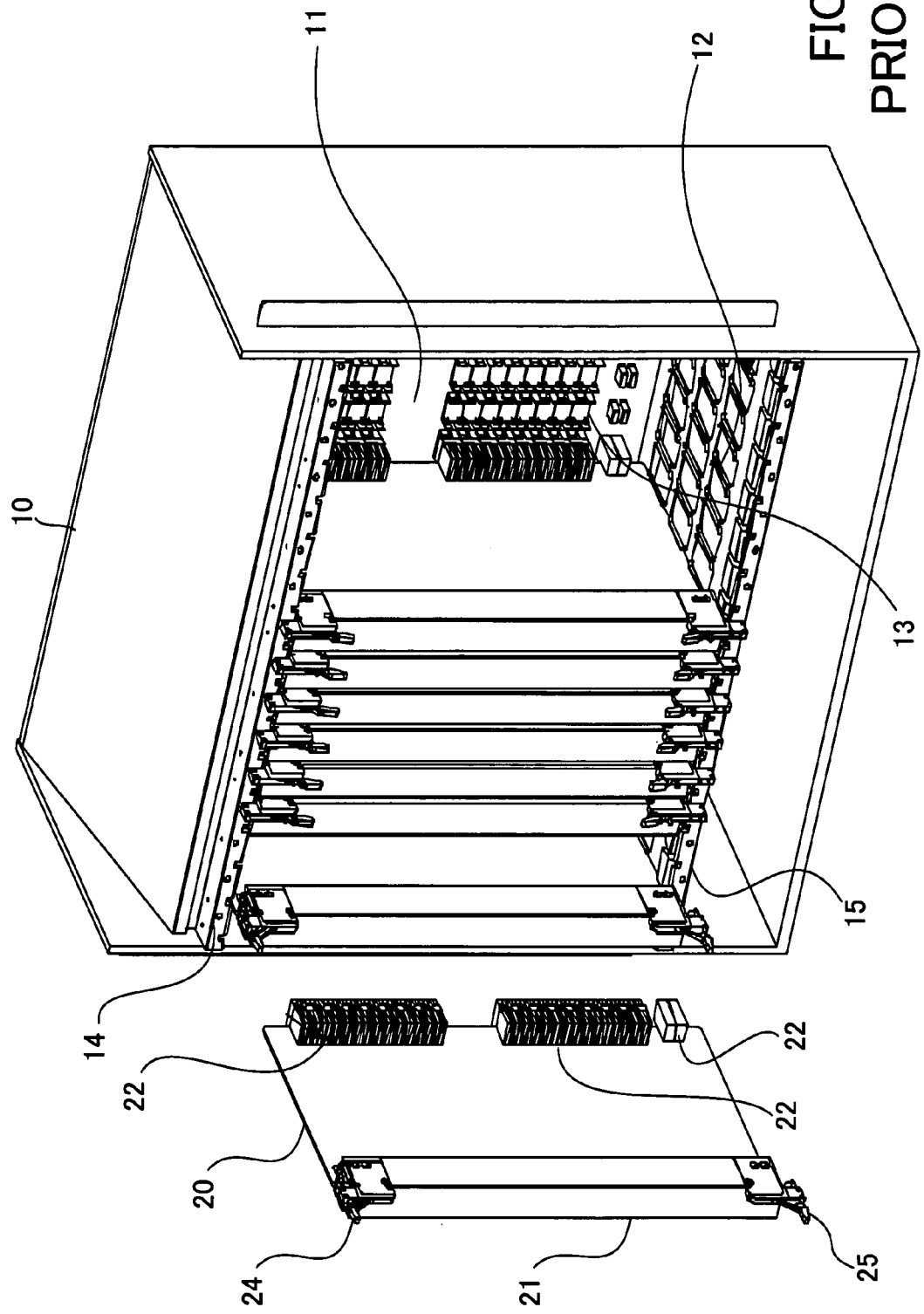
FIG. 19 is a perspective view showing the overall arrangement of a conventional bookshelf-type electronic apparatus having a backplane.
Figure 21:
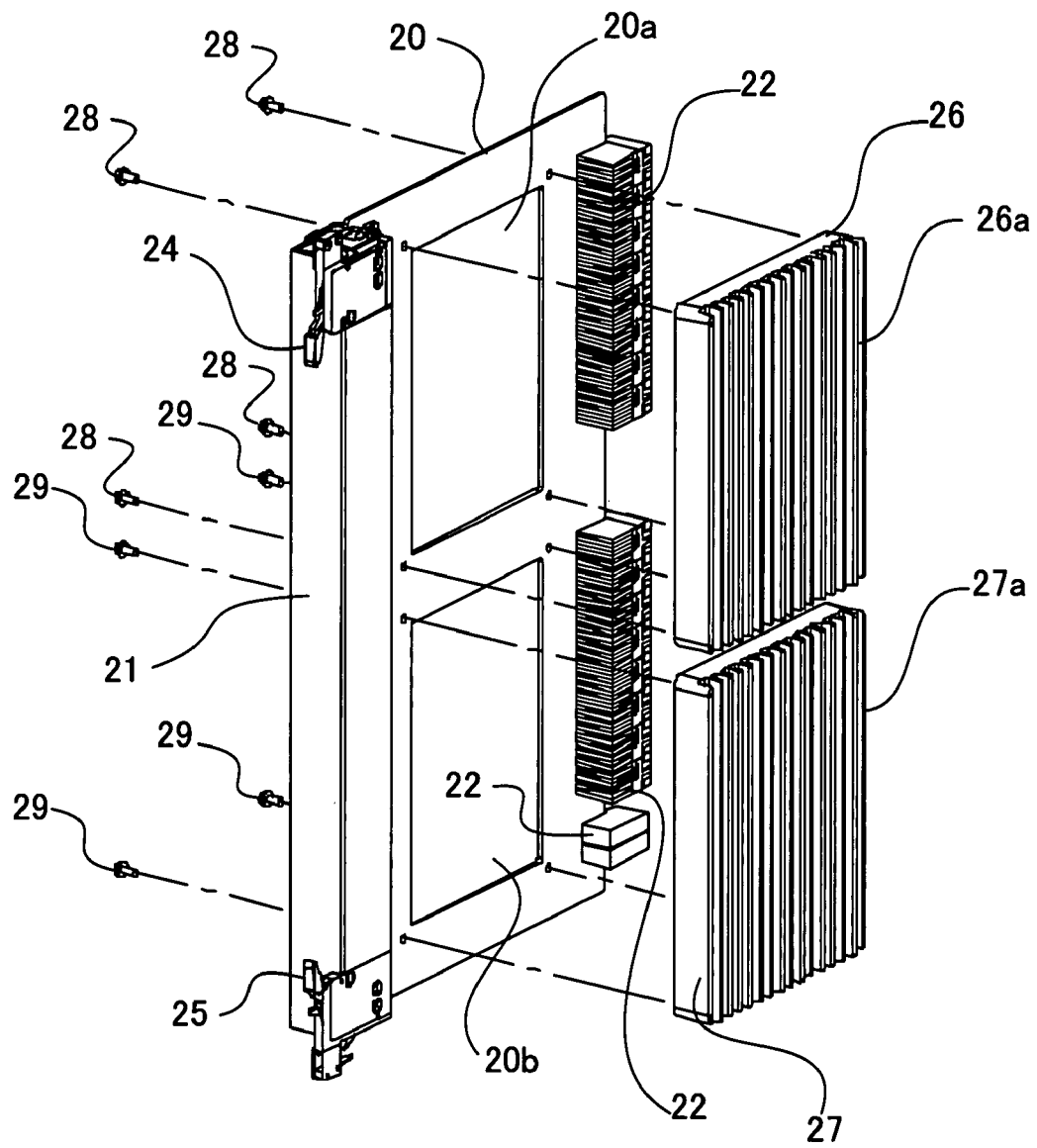
FIG. 21 is a perspective view of a printed board assembled as a conventional plug-in unit.
Figure 22:
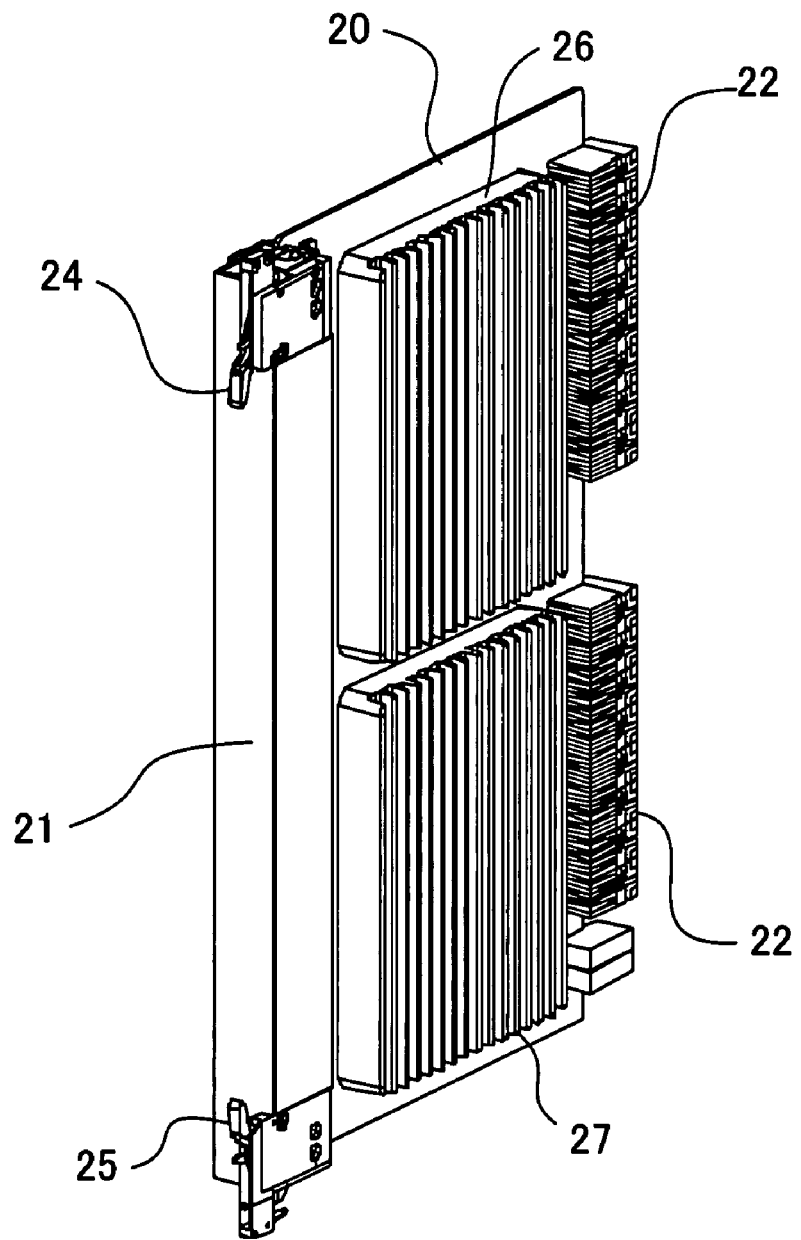
FIG. 22 is an exploded perspective view of the conventional plug-in unit.
Figure 23:
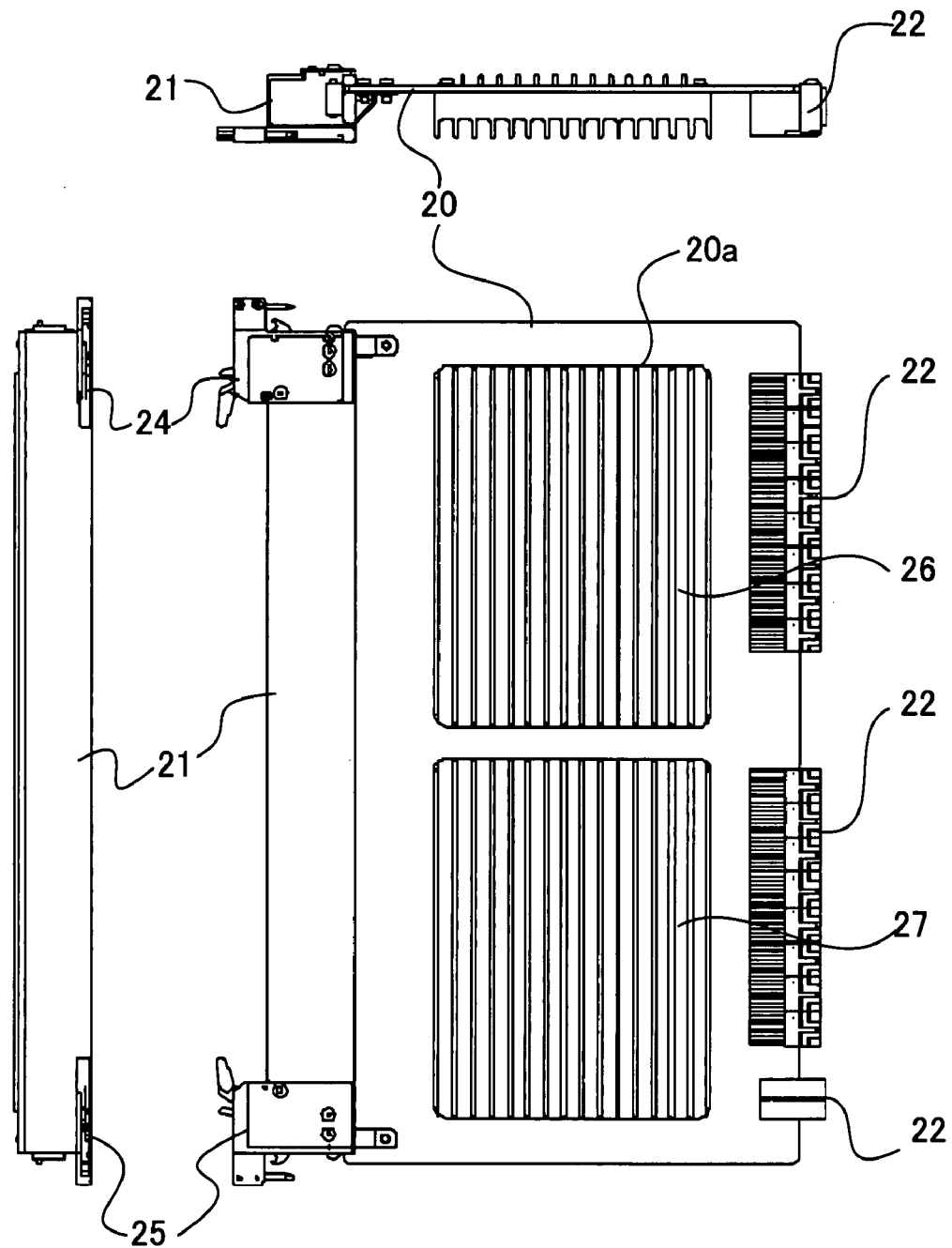
FIG. 23 is a three-view diagram of the conventional plug-in unit showing the front, the top, and a side thereof.
Figure 24:
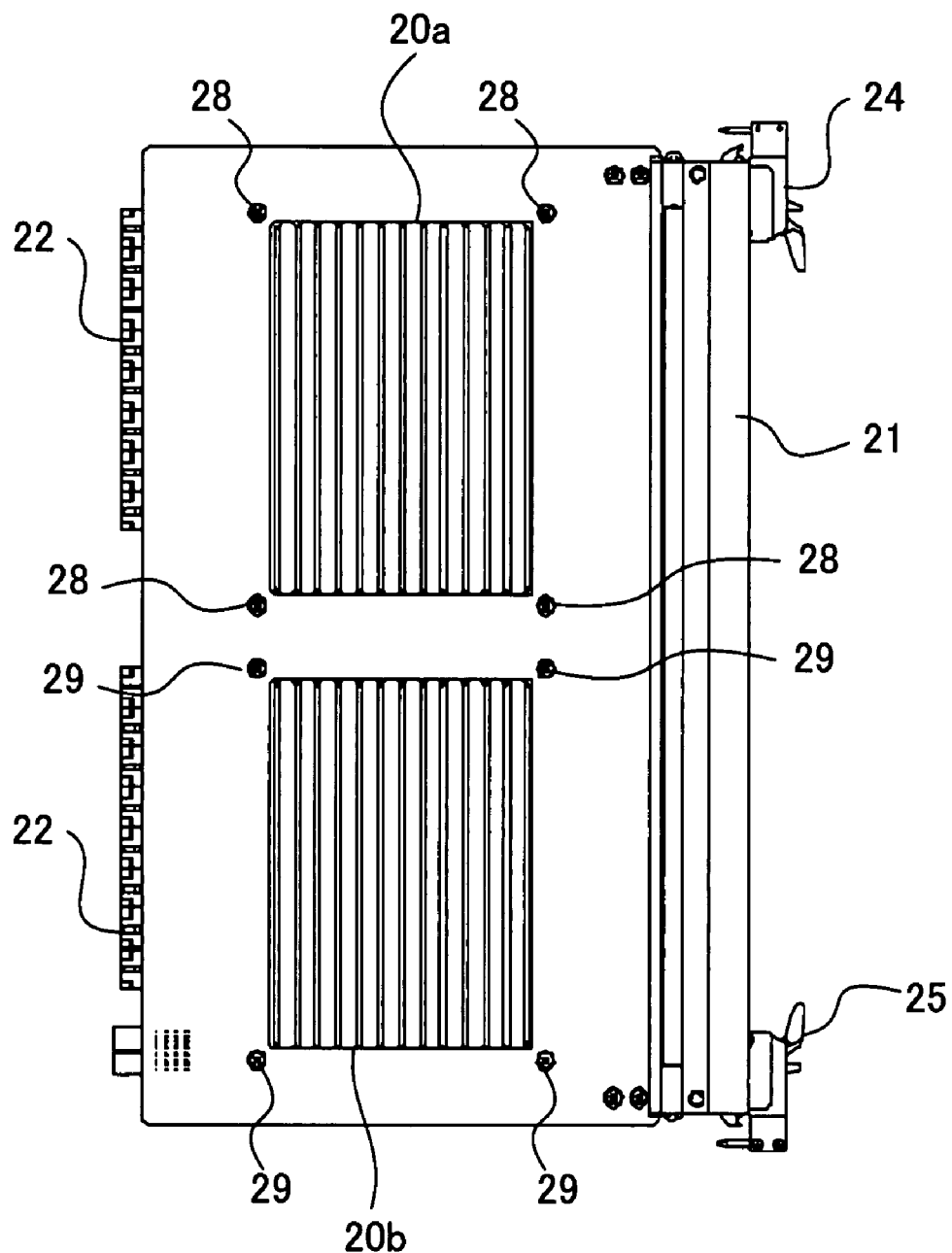
FIG. 24 is a rear view of the conventional plug-in unit.
Figure 25:
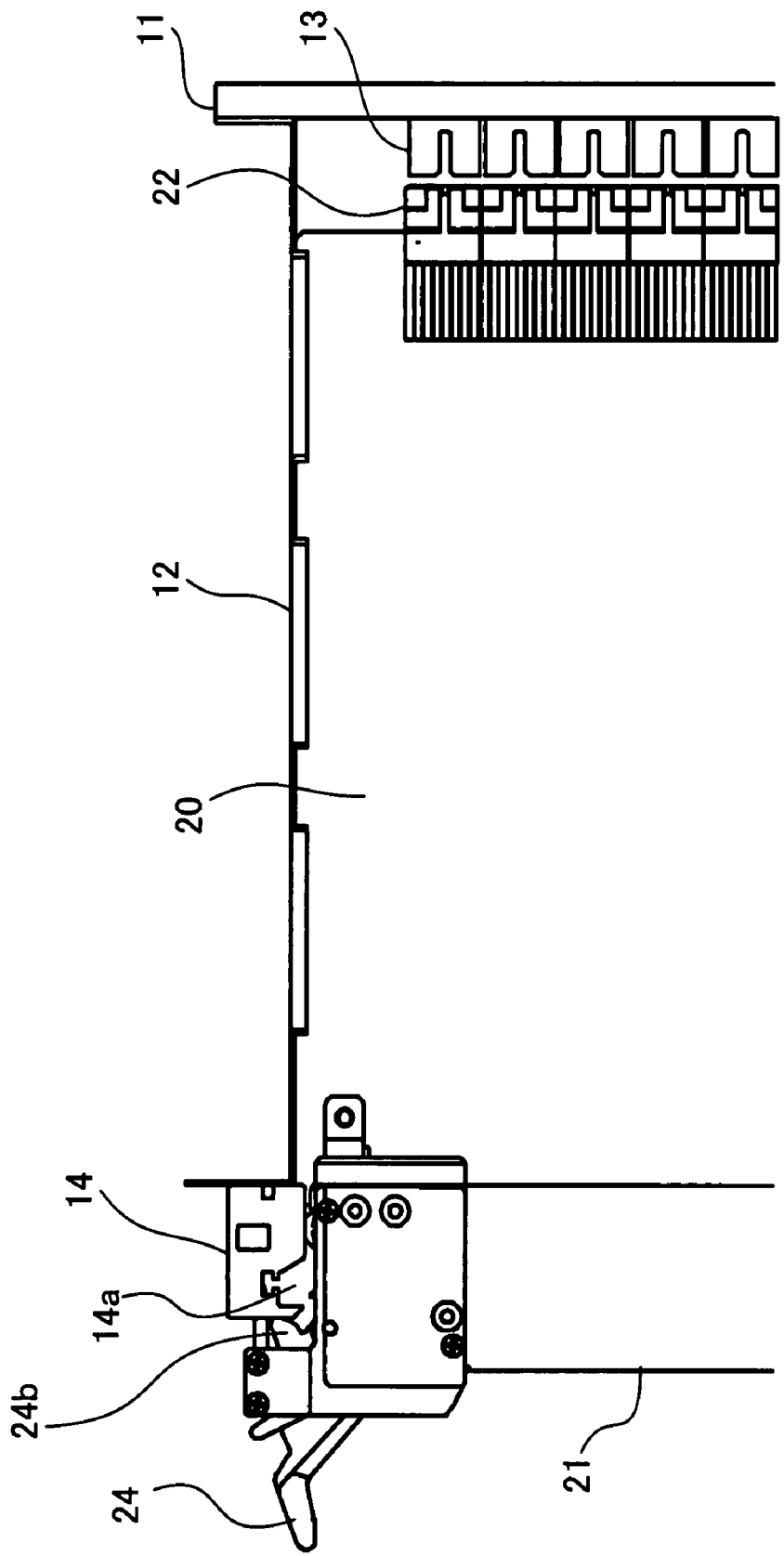
FIG. 25 is a view useful in explaining a first stage of a plugging-in operation of a plug-in unit in the conventional electronic apparatus.
Figure 26:
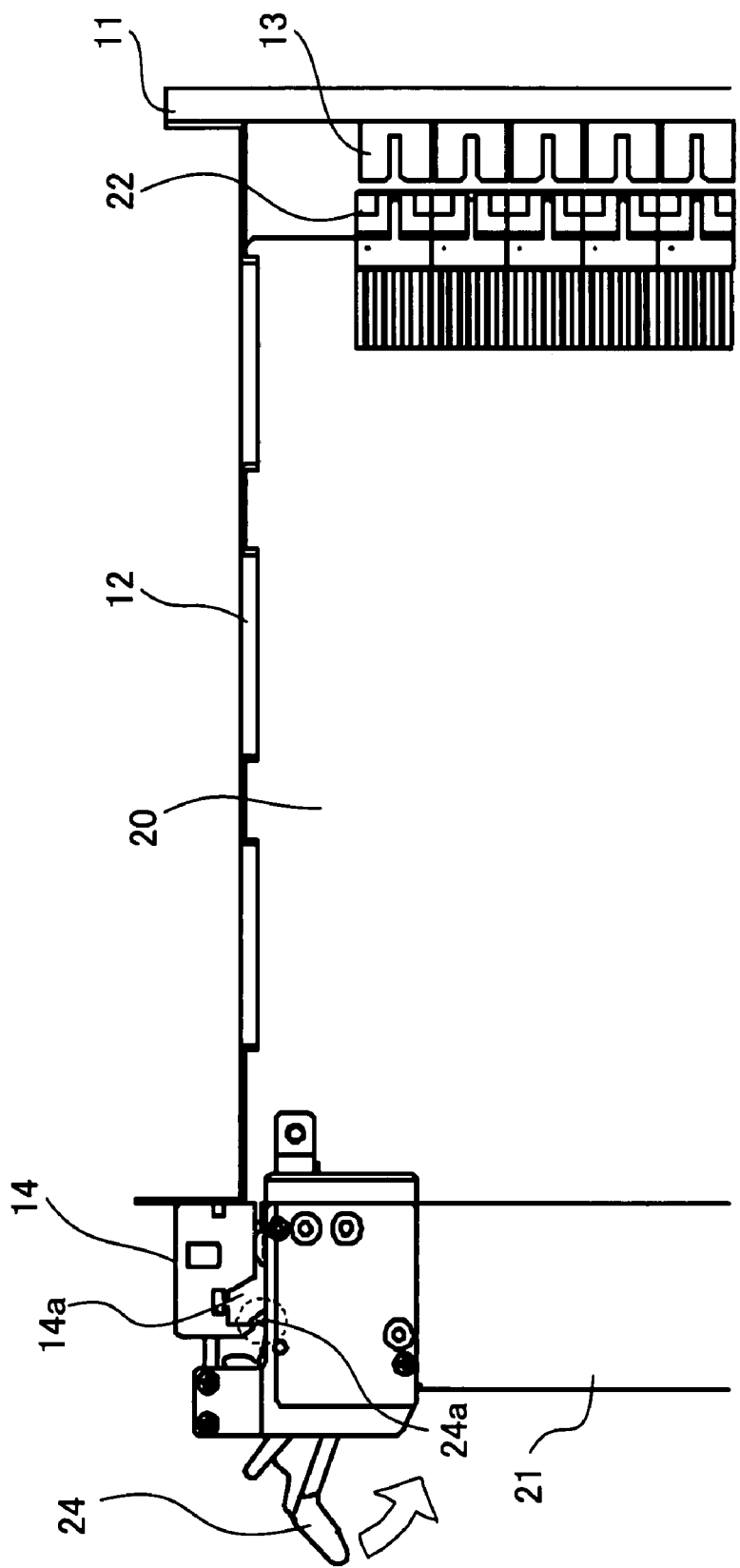
FIG. 26 is a view useful in explaining a second stage of the plugging-in operation.
Figure 27:
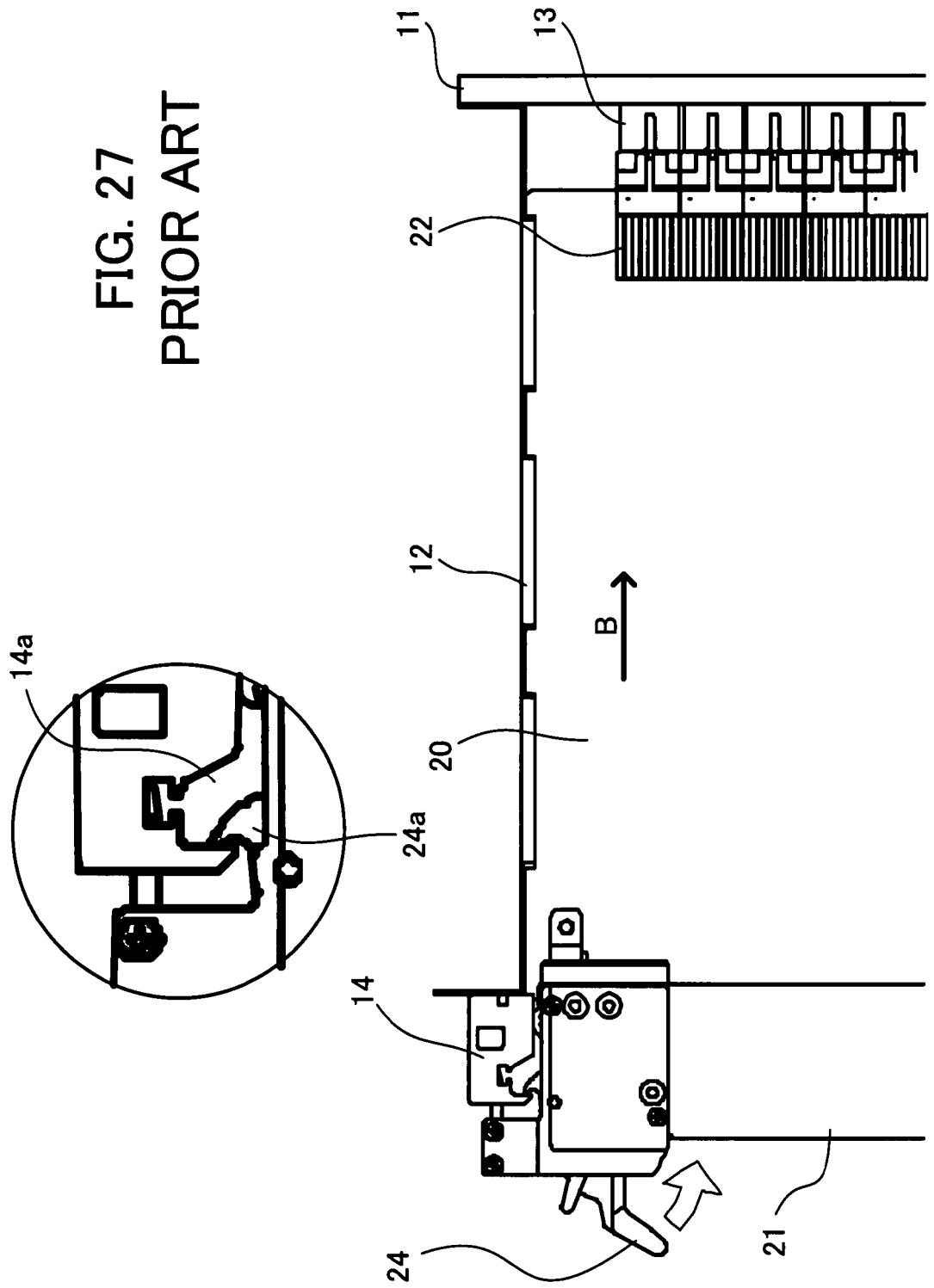
FIG. 27 is a view useful in explaining a third stage of the plugging-in operation.
Figure 28:
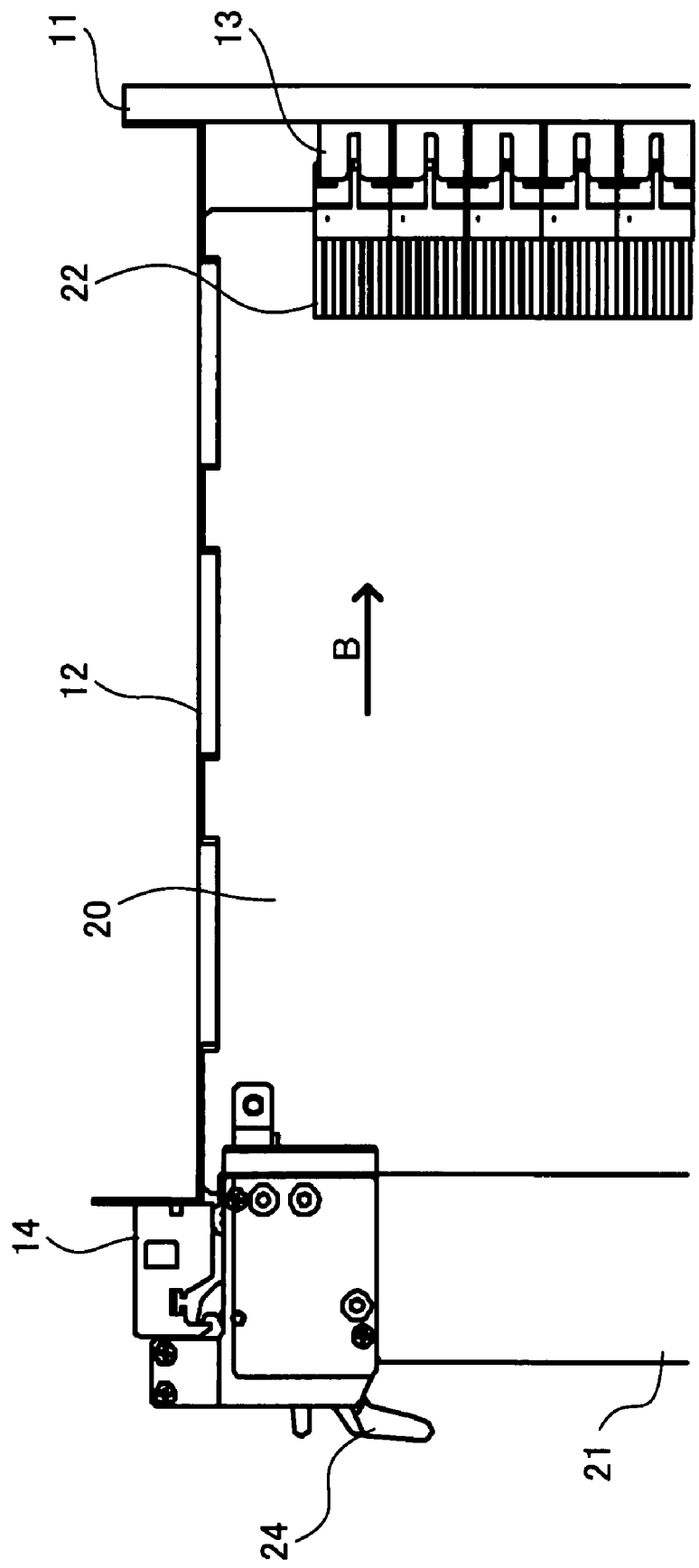
FIG. 28 is a view useful in explaining the plug-in unit connected to the backplane of the conventional electronic apparatus.
Figure 29:
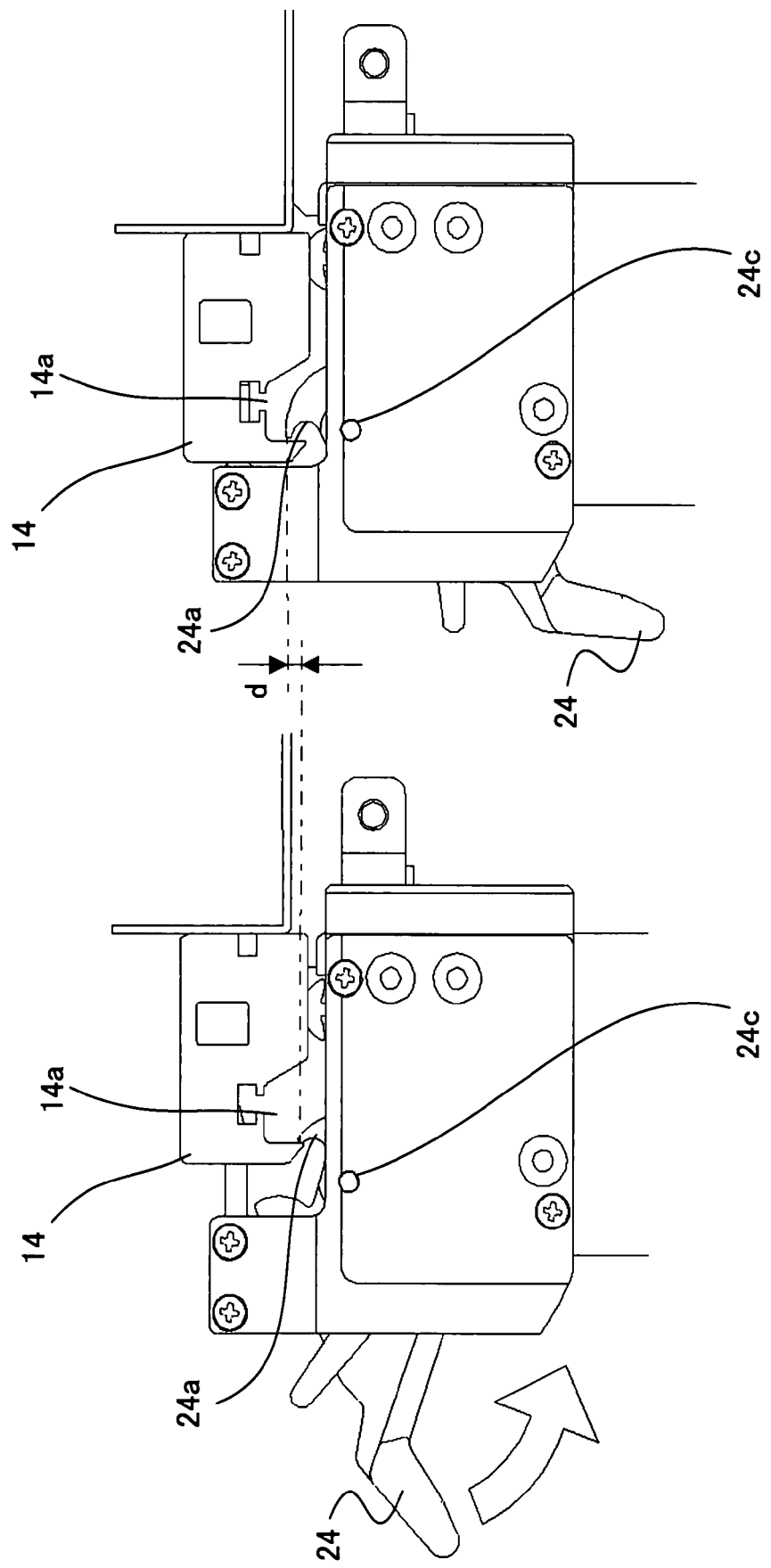
FIG. 29 is a view useful in explaining problems with the plugging-in operation of a plug-in unit in the conventional electronic apparatus.

FIG. 1 is a perspective view showing the overall arrangement of a bookshelf-type electronic apparatus according to the present invention. FIG. 2 is a partial explanatory view of the electronic apparatus with a plug-in unit connected to a backplane thereof. Component elements in FIG. 1 corresponding to those of the conventional device in FIG. 19 are designated by identical reference numerals.

As shown in FIG. 1, a shelf 1 forms a subrack unit having a backplane 11, as a motherboard, disposed on a rear side at a predetermined depth location, and a plurality of plug-in units are in orderly arrangement in the shelf 1. On the backplane 11 of the shelf 1, there are arranged plug-in connectors 13. A printed board 20 has a front panel 21 provided on an operator side thereof as a viewed in the insertion direction, and plug-in connectors 22 and a guide module, not shown, provided on a deep side thereof as viewed in the insertion direction. As distinct from the conventional printed board 20 (see FIG. 19), no card levers are provided on the printed board 20.

The shelf 1 has a guide plate 2 disposed on the side toward a bottom plate 1a thereof, for guiding the lower side of the printed board 20, and a guide plate 3, as shown in FIG. 2, disposed on the side toward a top plate 1b thereof for guiding the upper side of the printed board 20. The shelf 1 is distinguished from the conventional shelf 10 (see FIG. 19) in that card levers 4 and 5 are pivotally supported on the front surfaces of the respective guide plates 2 and 3, on a slot-by-slot basis.

On outer sides of the respective guide plates 2 and 3, arms 6 and 7 having respective base parts thereof connected to the card levers 4 and 5, are formed such that they extend toward the backplane 11 of the shelf 1. The printed board 20 has engaging members 8 and 9 provided on respective upper and lower side end parts thereof, for engagement with free ends of the respective arms 6 and 7.

The PIU plug-in/plug-off mechanism for the electronic apparatus constructed as above is formed for each slot of the shelf 1 in a vertically symmetrical fashion. More specifically, the pair of card levers 4 and 5 which are pivotally operated on the front surfaces of the respective guide plates 2 and 3 are at the outset in a position parallel with the guide plates 2 and 3, and then, after the printed board 20 is inserted to a position where the plug-in connectors 22 thereof come into contact with the plug-in connectors 13 on the backplane 11, the card levers 4 and 5 are operated to turn in respective directions for contact with the front panel 21. As a consequence, first, the free ends of the respective arms 6 and 7 are engaged with the engaging members 8 and 9, respectively. Then, as the card levers 4 and 5 are further turned, the free ends of the respective arms 6 and 7 press the printed board 20 via the engaging members 8 and 9 toward the backplane within the shelf 1 to thereby plug the plug-in connectors 22 into the plug-in connectors 13.

In plugging the printed board 20 off the plug-in connectors 13, the card levers 4 and 5 are turned in the opposite direction to cause the free ends of the respective arms 6 and 7 to press the engaging members 8 and 9 in the opposite direction.

Next, the above-described PIU plug-in/plug-off mechanism will be described in more detail. Although this description is given of an upper set of component elements of the PIU plug-in/plug-off mechanism having the vertically symmetrical construction, it is to be understood that a lower set of component elements thereof have the same construction.

Figure 3:
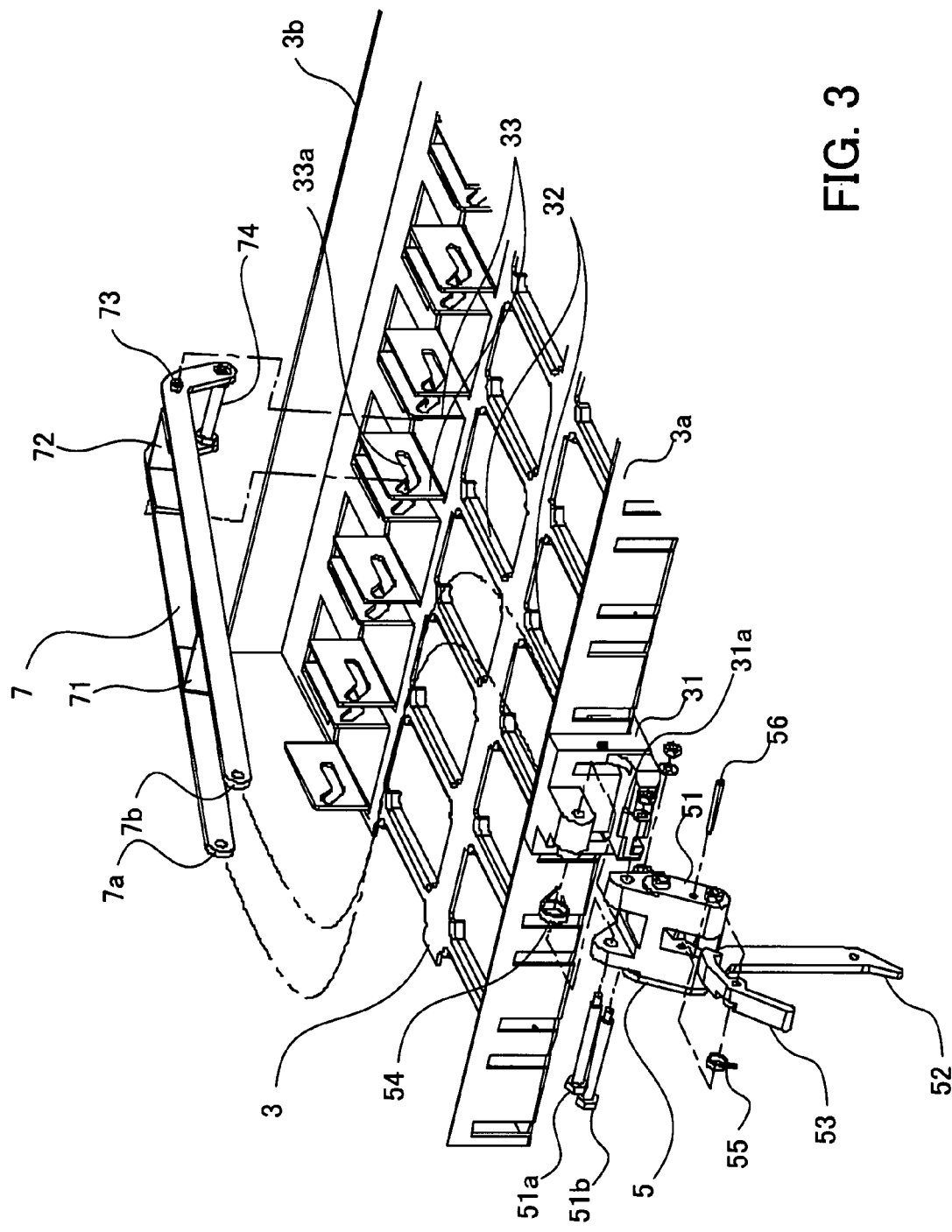
FIG. 3 is an exploded perspective view of essential parts of the PIU plug-in/plug-off mechanism according to a first embodiment of the present invention.

FIG. 3 is an exploded perspective view of essential parts of the PIU plug-in/plug-off mechanism according to the first embodiment.

The guide plate 3 has a front plate 3a erected therefrom on the front side of the shelf 1. Holder blocks 31 (only one of which is shown in FIG. 3) are fixed to the front plate 3a at predetermined space intervals, for holding the respective card levers 5. Guide rails 32 are formed in the lower surface of the guide plate 3 at predetermined space intervals such that they extend to the rear side of the shelf 11. The printed board 20 inserted into the shelf 1 is guided to the backplane 11 along the associated guide rails 32. Further, the guide plate 3 is formed with an end plate 3b that secures the backplane 11 thereto, and guide pieces 33 cut and erected from the guide plate 3 are arranged in the vicinity of the end plate 3b. Each of the guide pieces 33 is formed with a guide groove 33a. The guide groove 33a is in the form of an elongated slot having a front part extending obliquely upward and a rear part extending horizontally.

The card lever 5 is comprised of a card lever body 51, an operating handle 52, and a lock lever 53. The card lever body 51 is pivotally mounted to the holder block 31 by a first shaft 51a. The base end of the arm 7 is connected to the card lever body 51 by a second shaft 51b such that when the operating handle 52 is turned, a force for moving the arm 7 in the front-rear direction acts on the arm 7.

A card lever-urging spring 54 (first resilient member) is wound around the first shaft 51a, so that when no force is applied to the operating handle 52, the card lever body 51 urges the arm 7 in a direction in which the arm 7 is pulled toward an operator side. Therefore, the operating handle 52 is also held in a horizontal position to keep open a passage through which the printed board 20 is to be inserted into the shelf 1.

The lock lever 53 is pivotally mounted to the card lever body 51 by a spring pin 56 together with a lock lever-urging spring 55 such that the foremost end of the lock lever 53 is engaged with a lock-receiving part 31a formed in the holder block 31. The lock lever 53 is configured such that it is operated by a force of the lock lever-urging spring 55 when the printed board 20 is fitted in the shelf 1, to disable the turn of the operating handle 52, whereby it is capable of holding the card lever 5 in a locked state.

The arm 7 comprises a pair of elongated plates 7a and 7b connected to the card lever body 51 by the second shaft 51b, reinforcing plates 71 and 72 connected to the intermediate portions of the respective elongated plates 7a and 7b, and a guide pin 73 and a push pin 74 each rotatably supported by the elongated plates 7a and 7b. Foremost end (free ends) of the elongated plates 7a and 7b are configured such that they are bent obliquely downward, and the opposite ends of the guide pin 73 supported at the bent portions of the respective elongated plates 7a and 7b are fitted in associated guide grooves 33a of the guide plate 3, respectively, whereby the elongated plates 7a and 7b in their entirety are held in a substantially horizontal position. The push pin 74 is attached to the foremost ends of the bent portions of the respective elongated plates 7a and 7b such that it is positioned below the guide pin 73 and on the lower surface of the guide plate 3.

Next, operations for plugging in the printed board 20 will be sequentially described with reference to FIGS. 4 to 8. Although this description is given of an upper set of component elements of the PIU plug-in/plug-off mechanism having the vertically symmetrical construction, it is to be understood that the same operations are carried out on a lower set of component elements thereof.

Figure 4:
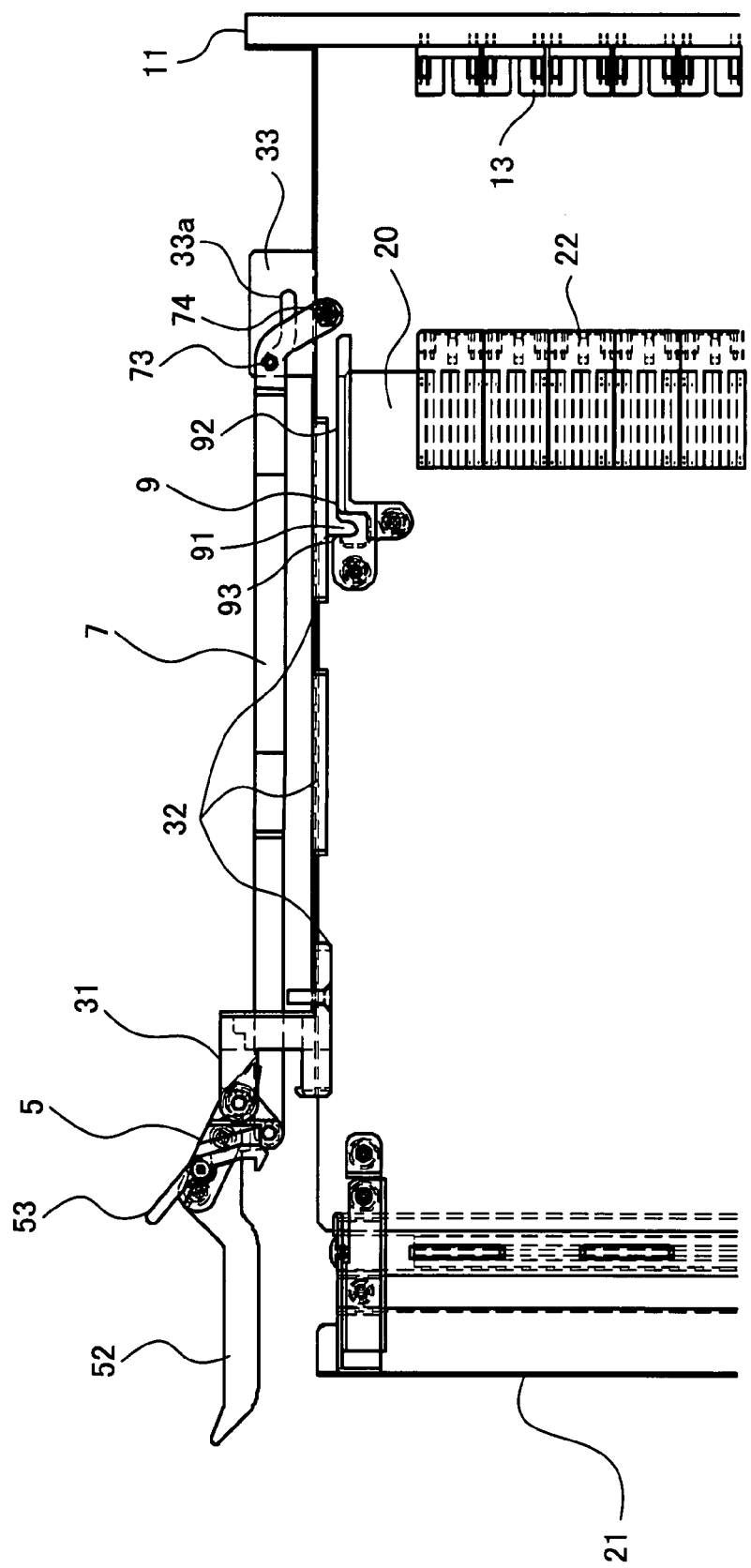
FIG. 4 is a view useful in explaining a first stage of a plugging-in operation of a plug-in unit in the electronic apparatus according to the first embodiment.

FIG. 4 is a view useful in explaining a first stage of the plugging-in operation of a plug-in unit in the electronic apparatus according to the first embodiment.

First of all, a description will be given of the construction of the engaging member 9 provided at the leading end of the printed board 20. The engaging member 9 is screwed to the leading end of the printed board 20, and is comprised of a flat part 92 formed with an open recess 91 and extending in the insertion direction from the open recess 91 to an end face of the printed board 20, where the plug-in connectors 22 are arranged, and a front edge part 93 formed on the operator side of the open recess 91 such that it has an upper surface higher than the flat part 92. The open recess 91 has a width large enough for engagement with the push pin 74 provided at the free end of the arm 7 and a predetermined depth. In the present embodiment, the mounting position of the engaging member 9 on the printed board 20 is defined according to a distance between the backplane 11 and the guide pieces 33 of the guide plate 3. The positional relationship will be apparent from the following description of the plugging-in operation.

Referring to FIG. 4, first, the upper and lower sides of the printed board 20 are fitted into the respective guide rails 32, and then the whole plug-in unit is moved rearward (in the insertion direction) in the shelf 1. At this time, the card lever 5 is held in the horizontal position by the action of the card lever-urging spring 54, and the arm 7 connected to the card lever 5 is pulled toward the operator, as viewed in the insertion direction, whereby the guide pin 73 is held at a highest position in the guide groove 33a. Therefore, even when the plug-in unit is further pressed rearward in the shelf 1, a slight gap is maintained between the push pin 74 of the arm 7 and the flat part 92 of the engaging member 9, so that the printed board 20 is pushed to a position shown in FIG. 5 while maintaining its horizontal position with the flat part 92 kept from the push pin 74.

Figure 5:
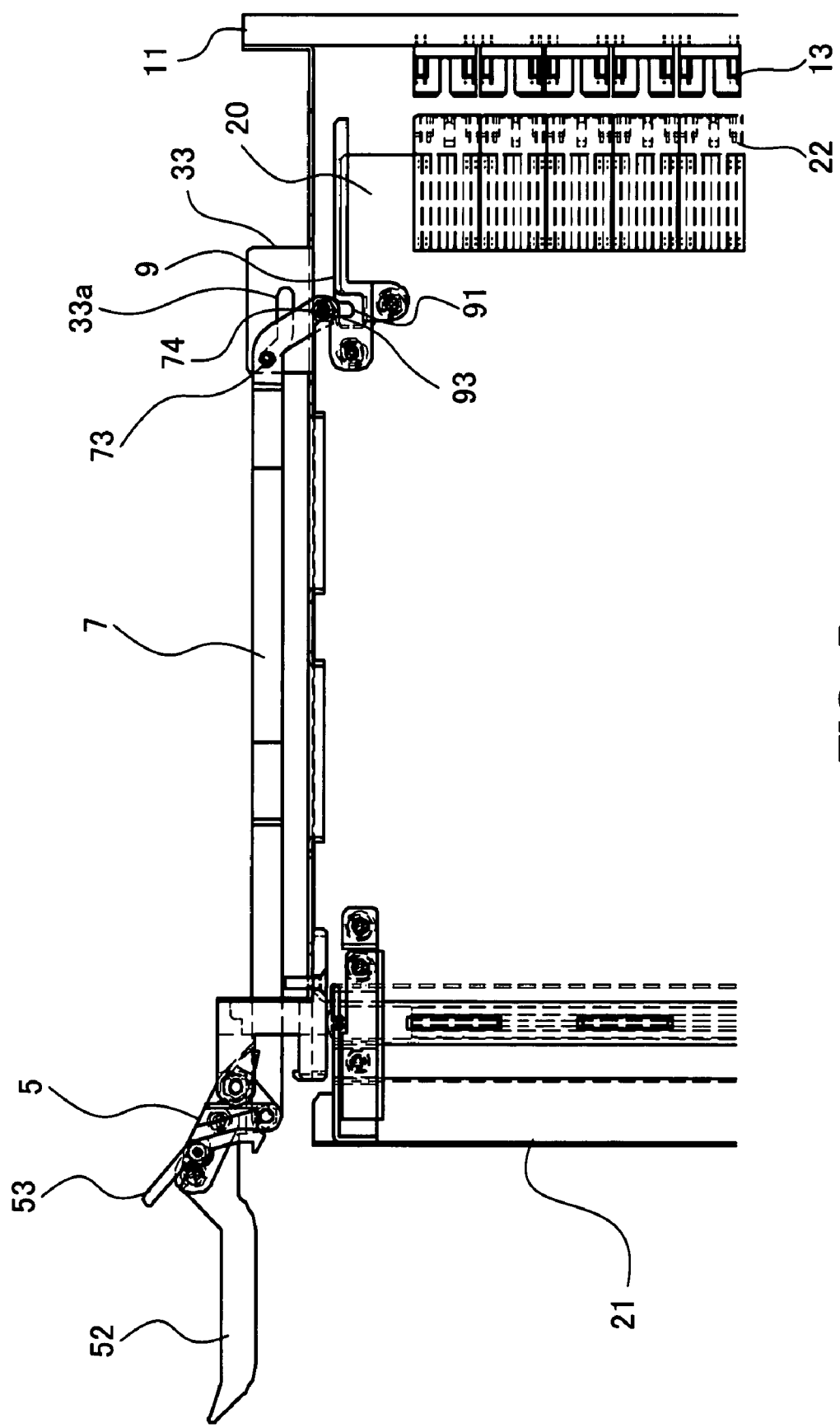
FIG. 5 is a view useful in explaining a second stage of the plugging-in operation.
Figure 6:
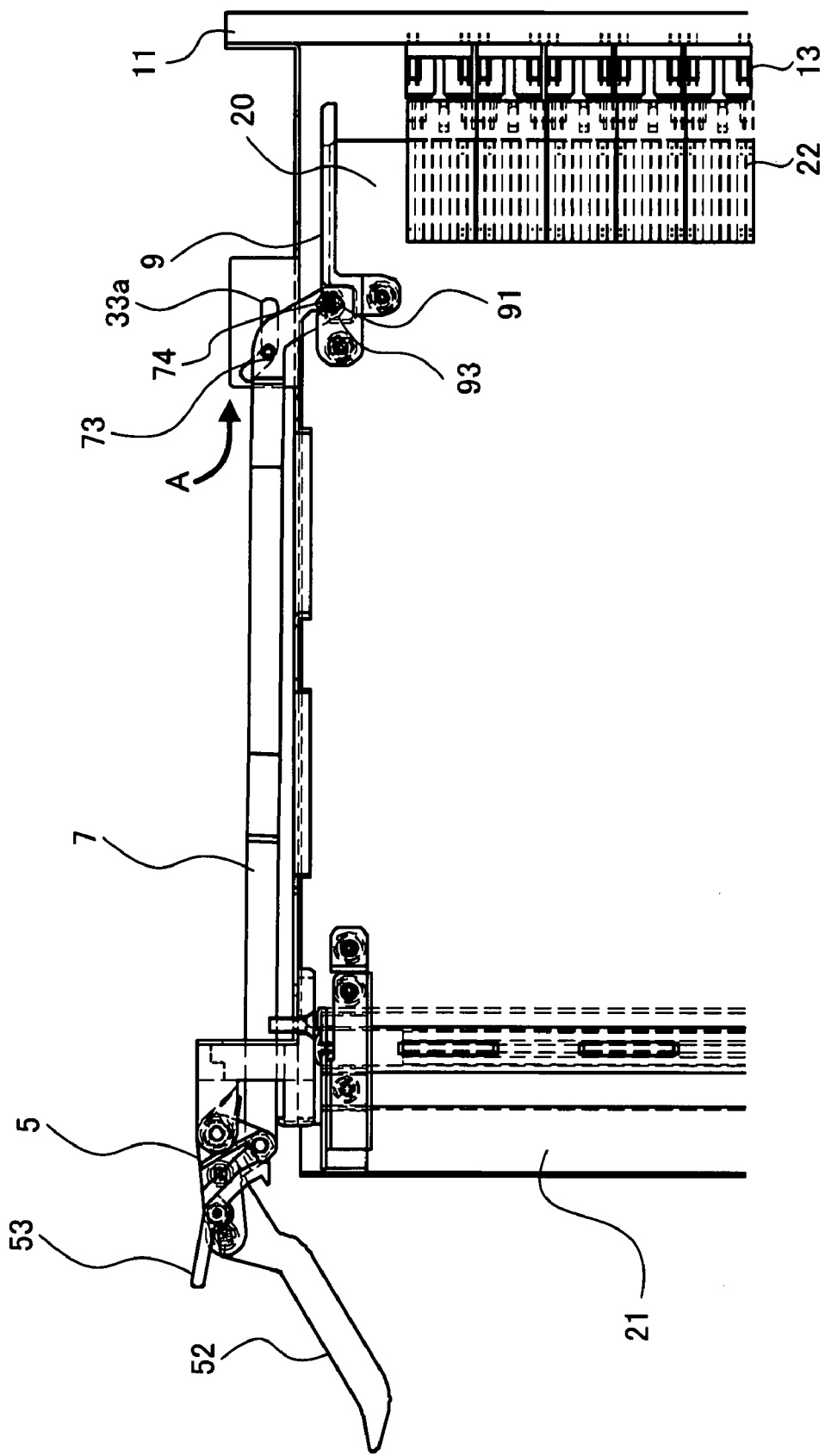
FIG. 6 is a view useful in explaining a third stage of the plugging-in operation.

Referring to FIG. 5, the front edge part 93 of the engaging member 9 of the plug-in unit comes into abutment with the push pin 74. At this time, a force for drawing the arm 7 in the insertion direction acts on the guide pin 73 in the guide grooves 33a, and the operating handle 52 of the card lever 5 shown in FIG. 5 starts counterclockwise rotation. Then, when a turning force is applied by the operating handle 52 so as to plug in the printed board 20, as shown in FIG. 6, the plug-in unit is further moved in the insertion direction, whereby a pressing force acts on the push pin 74 in contact with the front edge part 93 of the engaging member 9 to move the arm 7 rearward.

At this time, the opposite ends of the guide pin 73 supporting the free end of the arm 7 are guided while rolling along the guide grooves 33a and moved such that it becomes closer to the printed board 20, whereby the foremost end of the arm 7 is moved obliquely rearward. This brings the push pin 74 into deep engagement with the open recess 91 of the engaging member 9, whereby the printed board 20 is pushed to a position where the plug-in connectors 22 come into contact with the plug-in connectors 13 of the backplane 11. An arrow A in FIG. 6 indicates the motion of the arm 7 that moves while being guided by the guide grooves 33a.

Figure 7:
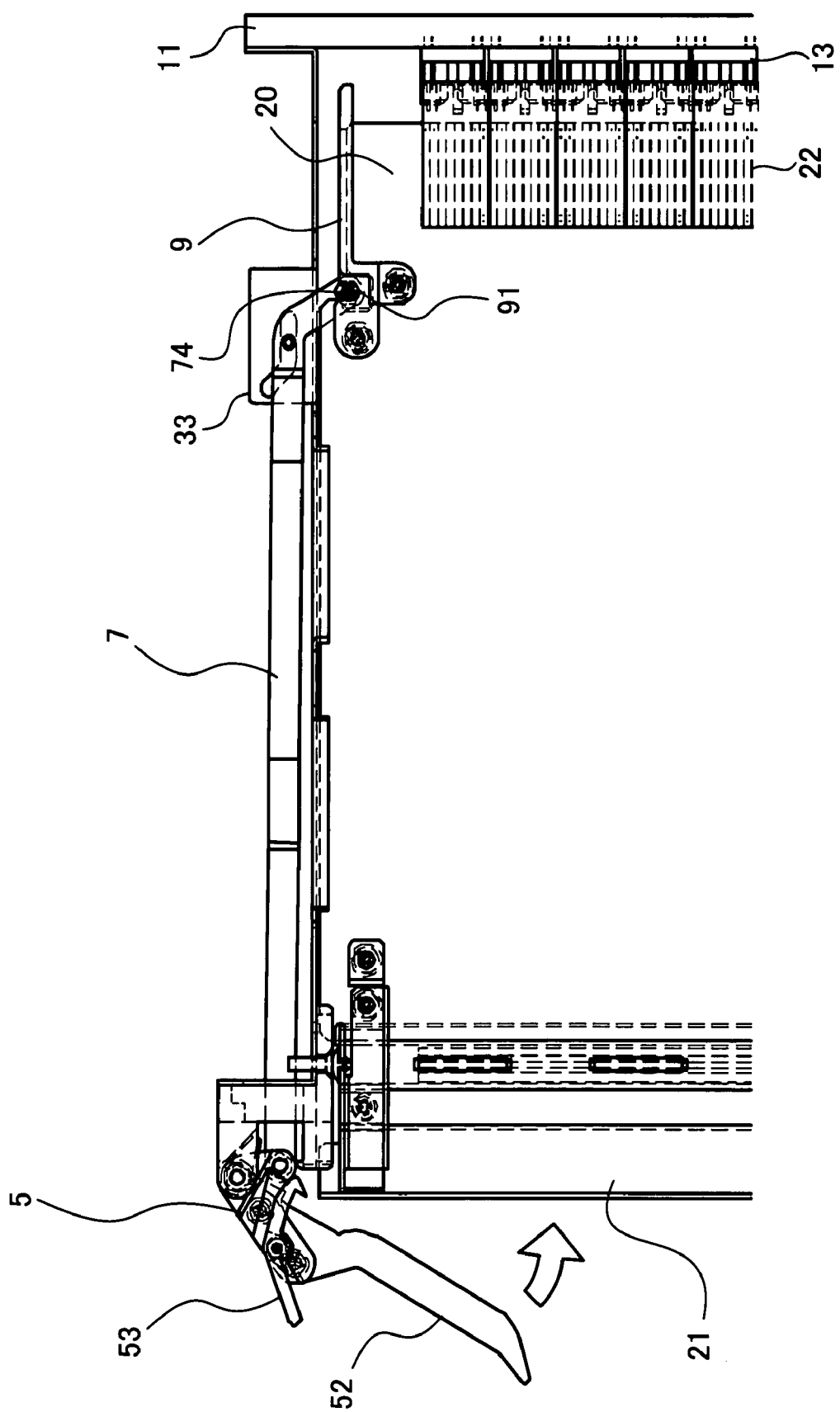
FIG. 7 is a view useful in explaining a fourth stage of the plugging-in operation.

FIG. 7 shows a state immediately before fitting of the plug-in connectors 22 of the printed board 20 is started. The operating handle 52 of the card lever 5 is intentionally turned counterclockwise in this state to thereby bring the push pin 74 into abutment with the rear edge of the open recess 91. When the card lever 5 is further turned with the push pin 74 held in contact with the rear edge of the open recess 91, a pressing force for moving the plug-in unit in the insertion direction acts on the engaging member 9 via the arm 7. This starts fitting of the plug-in connectors 22 with the plug-in connectors 13 without causing warping of the printed board 20.

Next, a process in which the lock lever 53 comes to work during the plugging-in operation of the plug-in unit will be described with reference to FIGS. 8 and 9. Although this description is given of an upper set of component elements of the PIU plug-in/plug-off mechanism having the vertically symmetrical construction, it is to be understood that the same description is applicable to a lower set of component elements thereof.

Figure 8:
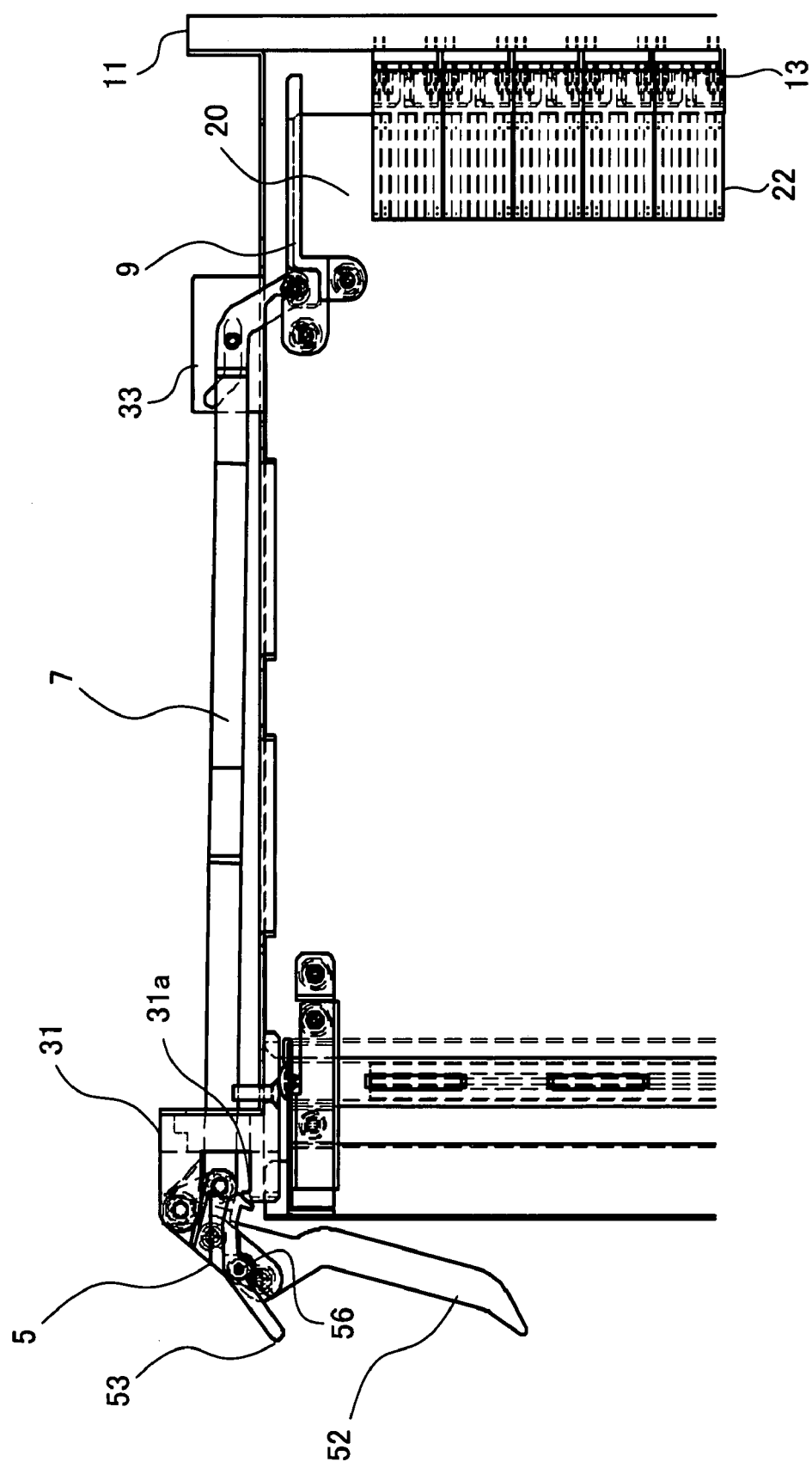
FIG. 8 is a view useful in explaining a fifth stage of the plugging-in operation.
Figure 9:
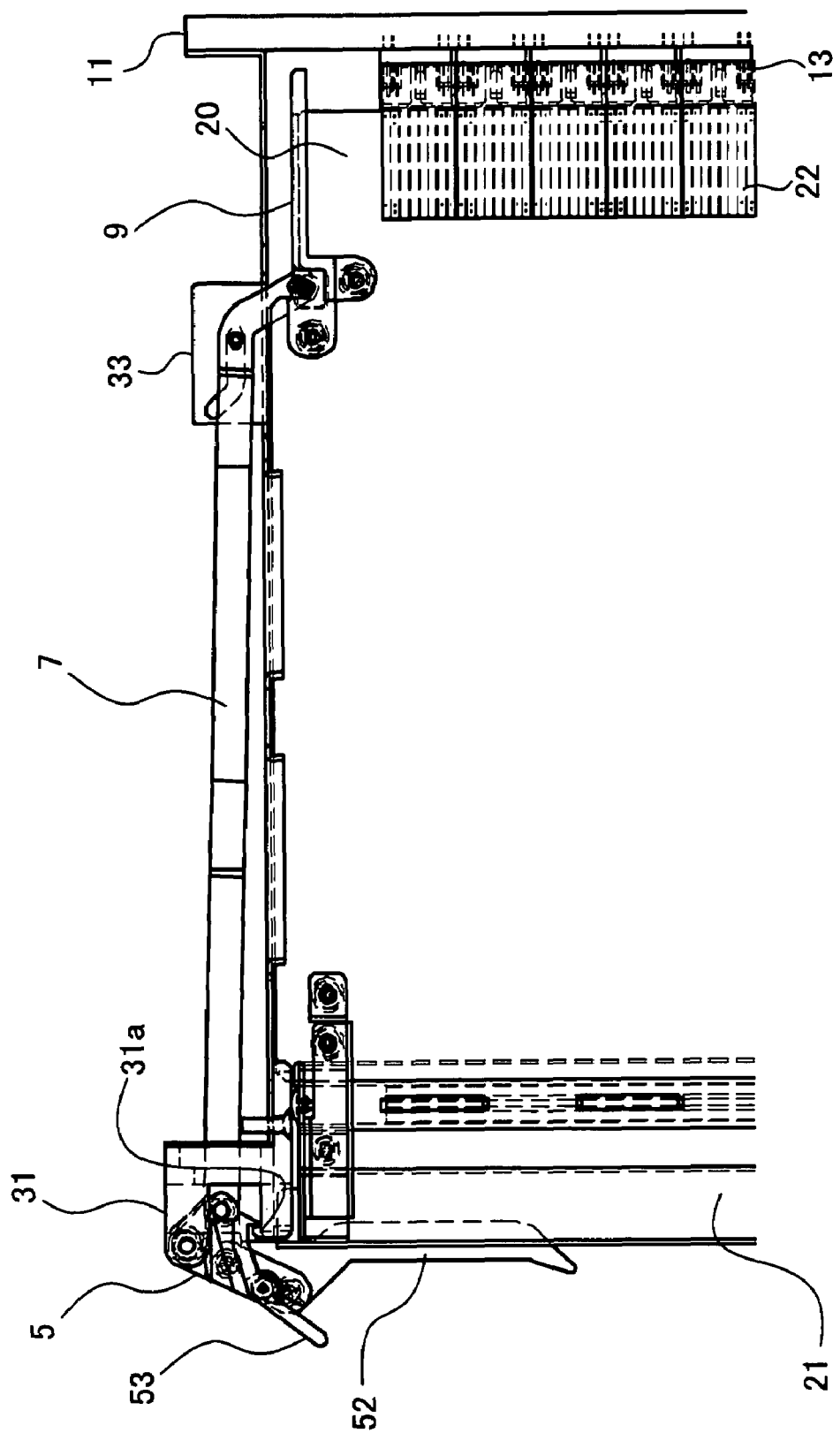
FIG. 9 is a view useful in explaining the plug-in unit connected to the backplane of the electronic apparatus.

As shown in FIG. 8, when the operating handle 52 of the card lever 5 is turned to a nearly vertical position, a sloping surface of the lock-receiving part 31a on the holder block 31 is brought into engagement with a sloping foremost end surface of the lock lever 53, whereby the lock lever 53 is turned about the spring pin 56 against the urging force of the lock lever-urging spring 55. In FIG. 9, the card lever 5 has been further turned. This completes fitting of the plug-in unit, and the lock lever 53 has climbed over the sloping surface of the lock-receiving part 31a, and the flat surface of the lock lever 53 and that of the lock-receiving part 31a are engaged with each other. In this state, the lock lever 53 is constantly urged by the lock lever-urging spring 55. Therefore, even if a force for turning the card lever 5 in the removal direction acts, the movement of the card lever 5 is restricted, which makes it possible to prevent careless removal of the plug-in unit from the plug-in connectors 13.

To plug off the plug-in unit, the locked state of the card lever 5 is cancelled by turning the lock lever 53 once against the urging force of the lock lever-urging spring 55, and then the card lever 5 is turned in the opposite direction. This causes an operation reverse to the above-described plugging-in operation to be carried out, whereby the printed board 20 is pushed in a direction away from the backplane 11 in the shelf 1.

According to the above-described bookshelf-type electronic apparatus, the PIU plug-in/plug-off mechanism is configured such that when the turning forces of the respective card levers 4 and 5 are converted into forces for pressing the arms 6 and 7 connected to the respective card levers 4 and 5 in the front-rear direction, to drive the guide pins 73 attached to the respective arms 6 and 7 along the associated ones of the guide grooves 33a formed in the shelf 1, the push pins 74 attached to the foremost ends of the respective arms 6 and 7 are brought into engagement with the respective engaging members 8 and 9. Therefore, when the card levers 4 and 5 are turned for plugging in/off the printed board 20, the turning forces of the respective card levers 4 and 5 are transmitted to the portion of the printed board 20 close to the backplane 11 via the respective arms 6 and 7 formed to extend toward the backplane 11 of the shelf 1, so that a force for plugging the printed board 20 into or out of the shelf 1 acts while suppressing bending of the printed board 20.

What is more, the PIU plug-in/plug-off mechanism of the present embodiment is configured such that when the portion of the printed board 20 close to the backplane 11 is pushed to plug in/out of the printed board 20, the guide pins 73 supported at the respective free ends of the arms 6 and 7 are guided along the guide grooves 33a of the respective guide pieces 33 cut and erected from each of the guide plates 2 and 3. Therefore, when the card levers 4 and 5 are turned in the removal direction, the associated push pins 74 come into engagement with only the front edge parts 93 of the open recesses 91 formed in the engaging members 8 and 9, respectively. On the other hand, when the card levers 4 and 5 are turned in the insertion direction, the associated push pins 74 are guided to respective deep positions of the engaging members 8 and 9 by the guide grooves 33a on the guide plates 2 and 3. This enables forces required for plugging in/out of the connectors to be applied to the printed board 20 with high efficiency.

Furthermore, since the card levers 4 and 5 are constantly urged in the removal direction by the urging forces of the respective card lever-urging springs 54, insertion of a plug-in unit into the shelf 1 is by no means hindered by the card levers 4 and 5 disposed at the respective upper and lower parts of the shelf 1.

Moreover, since the card levers 4 and 5 are each provided with the lock lever 53, respective operations of the card levers 4 and 5 are locked when plugging-in of the printed board 20 is completed, so that movement of the arms 6 and 7 in the opposite direction (removal direction) can be restricted.

Second Embodiment

Figure 10:
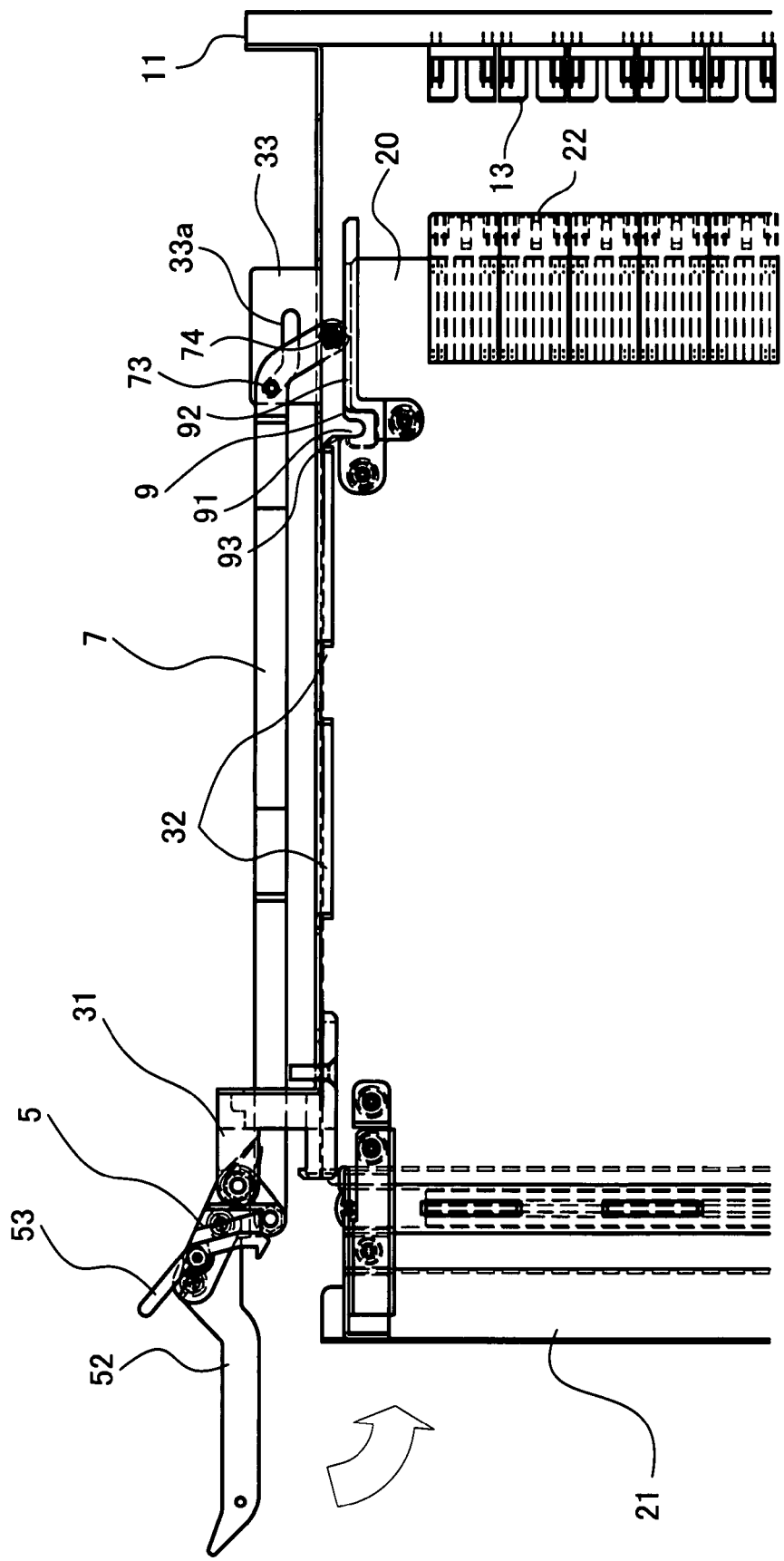
FIG. 10 is a view useful in explaining an erroneous operation which can occur in a process for plugging in a plug-in unit.

FIG. 10 is a view useful in explaining an erroneous operation which can occur in a process for plugging in a plug-in unit according to the above-described first embodiment. Although this description is given of an upper set of component elements of the PIU plug-in/plug-off mechanism having the vertically symmetrical construction, it is to be understood that the same description is applicable to a lower set of component elements thereof.

In FIG. 10, it is assumed that the card lever 5 was turned after the printed board 20 having been inserted to a certain depth in the shelf 1 and before engagement of the push pin 74 in the open recess 91 of the engaging member 9. When the operating handle 52 of the card lever 5 is turned in a direction indicated by an arrow in this state, the arm 7 is pushed rightward, as viewed in FIG. 10, and hence the guide pin 73 provided at the free end of the arm 7 slides obliquely downward by being guided along the guide grooves 33a of the guide pieces 33. Therefore, the push pin 74 provided at the foremost end of the arm 7 is brought into a state uselessly pushing the flat part 92 of the engaging member 9.

An erroneous operation of the card lever 4 or 5 generates a pressing force that vertically acts on the printed board 20, and hence a vertical compressive force is applied to the printed board 20.

To solve this problem, in a PIU plug-in/plug-off mechanism according to the second embodiment of the present invention, the arrangement of the first embodiment is partially changed such that a retreat passage via which the guide pin 73 retreats is formed in each of the guide grooves 33a of the respective guide pieces 33. More specifically, the PIU plug-in/plug-off mechanism according to the second embodiment is configured such that the guide pins 73 are guided into the retreat passages if the card levers 4 and 5 are turned after insertion of the printed board 20 into the shelf 1 and before engagement between the open recess 91 of each of the engaging member 8 and 9 and the associated push pin 74.

Figure 11:
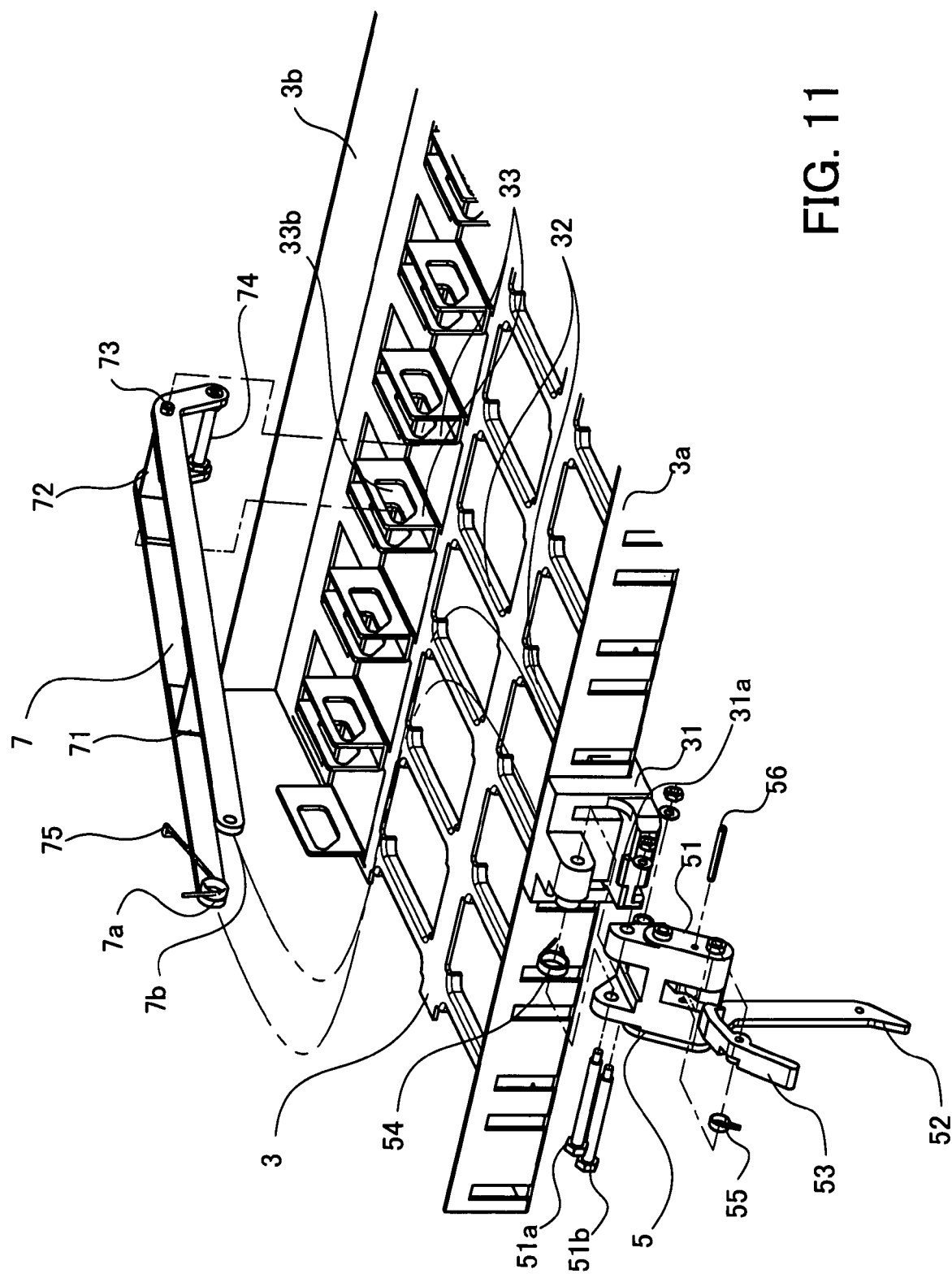
FIG. 11 is an exploded perspective view of essential parts of a PIU plug-in/plug-off mechanism according to a second embodiment of the present invention.

FIG. 11 is an exploded perspective view of essential parts of the PIU plug-in/plug-off mechanism according to the second embodiment. In FIG. 11, component parts corresponding to those of the first embodiment are designated by identical reference numerals, and a description will be given of only two different points from the arrangement shown in FIG. 3. Although this description is given of an upper set of component elements of the PIU plug-in/plug-off mechanism having the vertically symmetrical construction, it is to be understood that a lower set of component elements thereof have the same construction.

The first different point is that an arm-urging spring (second resilient member) 75 is wound around the second shaft 51b connecting the base part of the arm 7 to the card lever body 51. This arm-urging spring 75 applies a turning force acting in a direction of pushing the push pin 74 into the open recess 91 to the free end of the arm 7.

The second different point is that each guide piece 33 cut and erected from the guide plate 3 is formed with a guide groove 33b different in shape from the guide groove 33a in the first embodiment. A portion of this guide groove 33b toward the guide plate 3 is identical in shape to the guide groove 33a. However, the guide groove 33b has an upper portion formed as a space (retreat passage) for causing the guide pin 73 to retreat, and is configured such that the guide pin 73 is guided into the space if the card lever 5 is turned after insertion of the printed board 20 into the shelf 1 and before engagement of the push pin 74 in the open recess 91 of the engaging member 9.

FIGS. 12 to 17 are views useful in explaining an plugging-in operation of the plug-in unit in the electronic apparatus according to the second embodiment. Although this description is given of an upper set of component elements of the PIU plug-in/plug-off mechanism having the vertically symmetrical construction, it is to be understood that the same operations are carried out on a lower set of component elements thereof.

Figure 12:
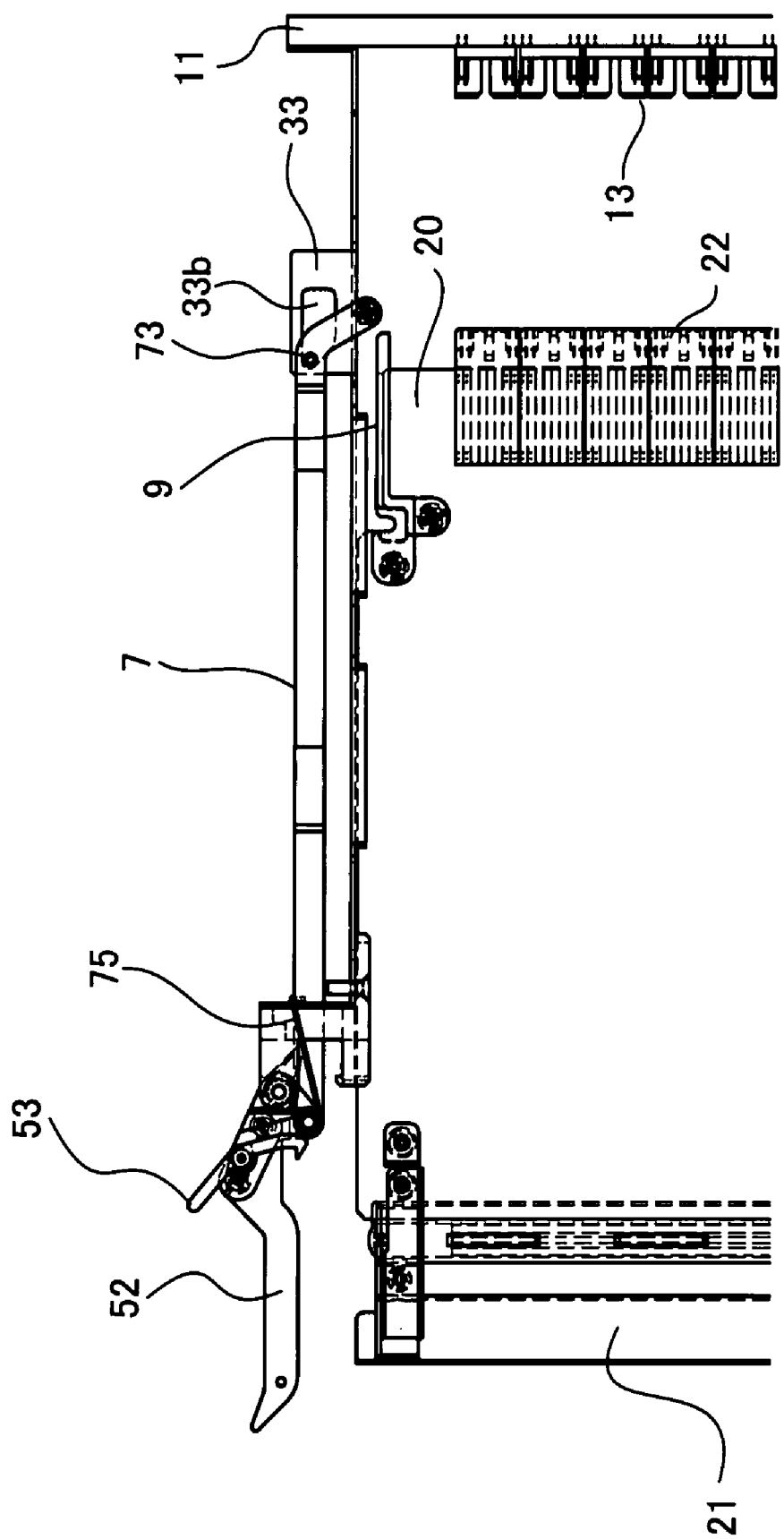
FIG. 12 is a view useful in explaining a first stage of a plugging-in operation of a plug-in unit in an electronic apparatus according to the second embodiment.

FIG. 12 shows a state corresponding to that shown in FIG. 4 in describing the first embodiment. The arm 7 is pulled toward the operator side, as viewed in the insertion direction, by the action of the guide lever-urging spring 54, whereby the guide pin 73 is positioned at an uppermost location in the guide groove 33b. At this time, the free end of the arm 7 is urged downward by the arm-urging spring 75, so that the guide pin 73 comes into abutment with a sloping surface of the lower edge of the guide groove 33b and is held in a state urged downward.

Figure 13:
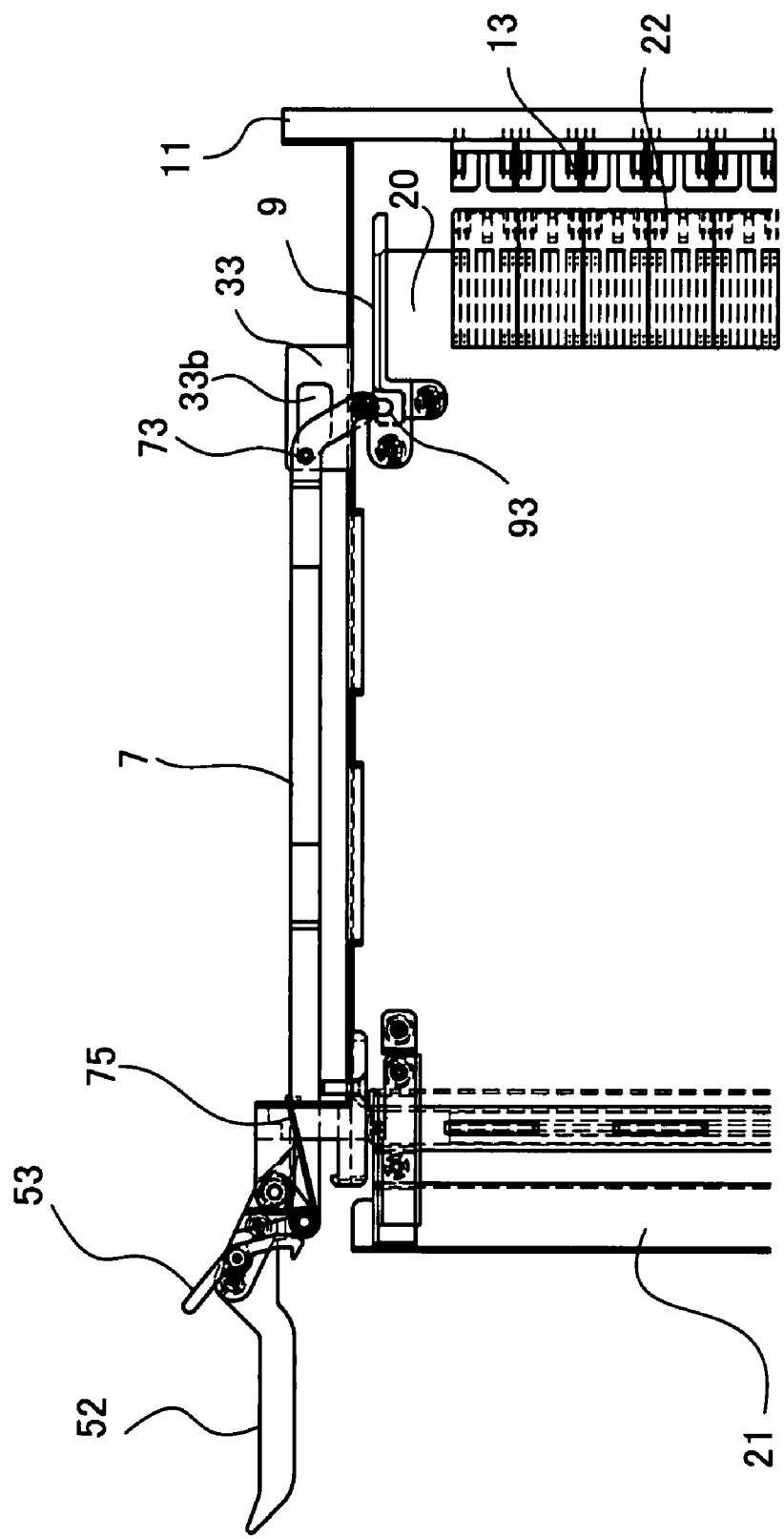
FIG. 13 is a view useful in explaining a second stage of the plugging-in operation.
Figure 14:
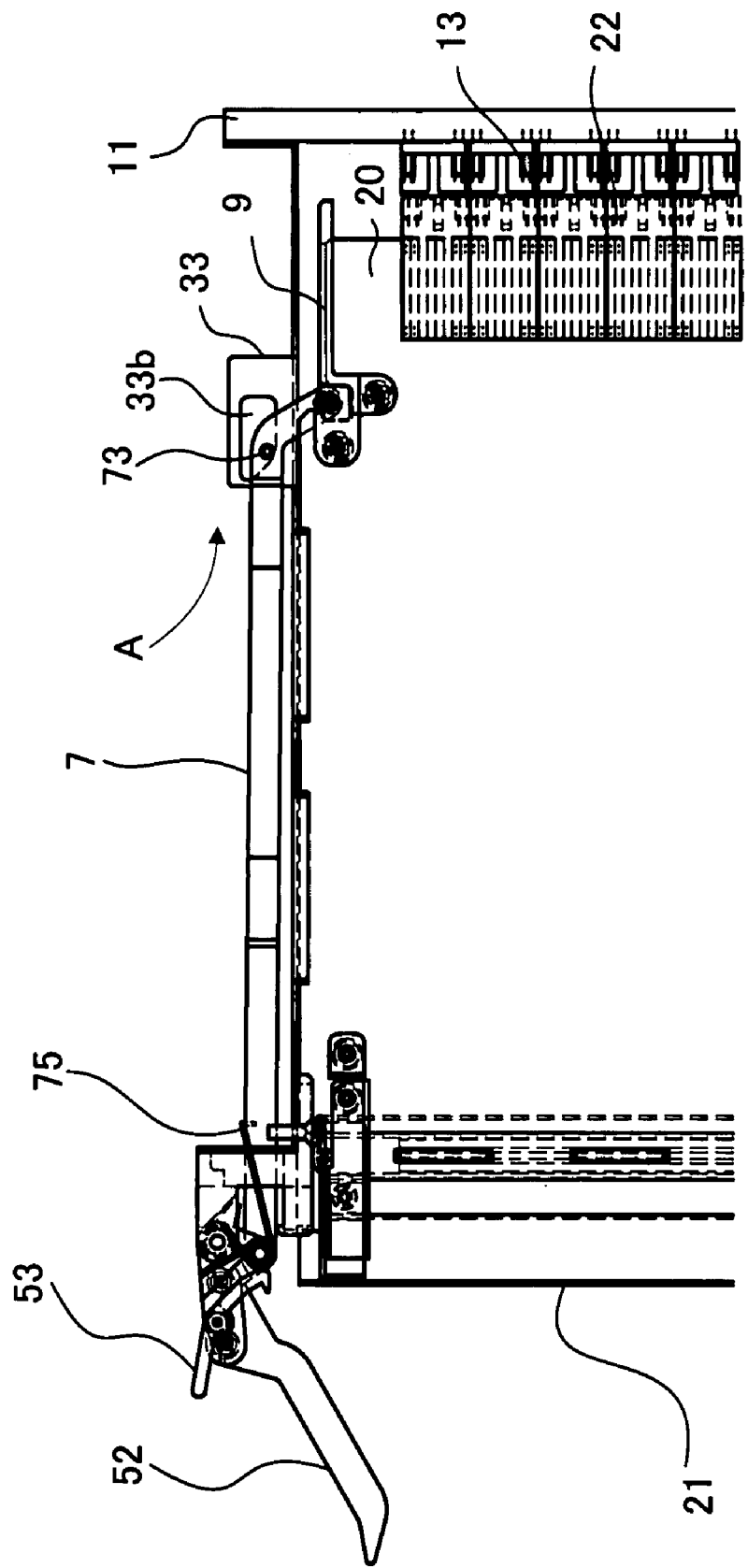
FIG. 14 is a view useful in explaining a third stage of the plugging-in operation.

Even when the plug-in unit is further pushed in this state, since a slight gap is maintained between the push pin 74 of the arm 7 and the flat part 92 of the engaging member 9 provided at the leading end of the printed board 20, the plug-in unit is brought to a position shown in FIG. 13, with the printed board 20 held in a horizontal position and the push pin 74 and the flat part 92 kept from contact with each other. At this time, the front edge of the engaging member 9 and the push pin 74 are brought into contact with each other, so that the arm 7 is pulled rearward. However, since the free end of the arm 7 is urged downward by the action of the arm-urging spring 75, the guide pin 73 moves along the lower edge of the guide groove 33b, and hence the push pin 74 provided at the foremost end of the arm 7 moves to a deep position of the open recess 91. In FIG. 14, the movement of the arm 7 moving by being guided by the guide groove 33b is indicated by an arrow A.

Figure 15:
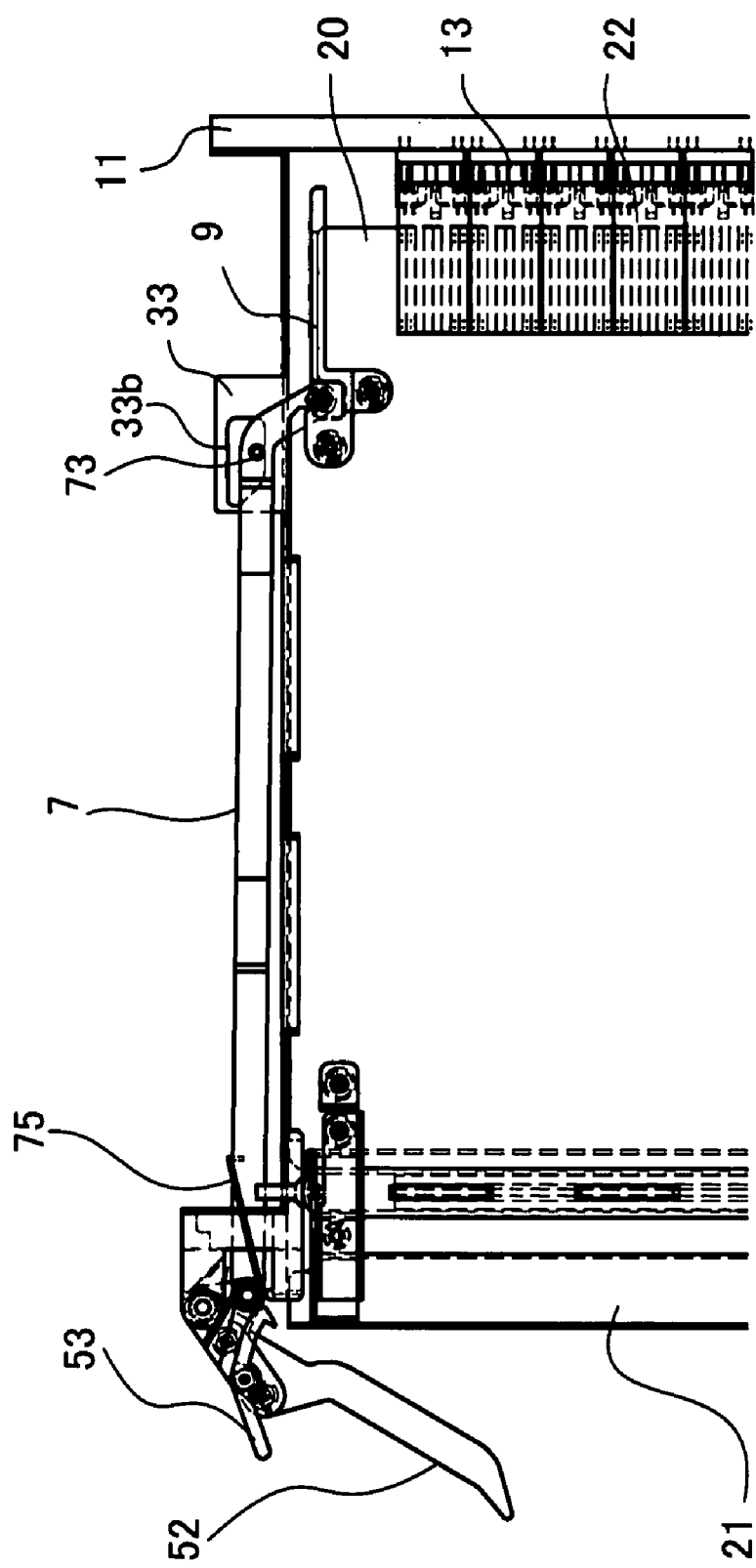
FIG. 15 is a view useful in explaining a fourth stage of the plugging-in operation.

FIG. 15 shows a state immediately before fitting of the plug-in connectors 22 of the printed board 20 into the plug-in connectors 13 on the backplane 11 is started. When the card lever 5 is further turned in this state, the pushing force for moving the plug-in unit in the insertion direction acts on the engaging member 9 of the plug-in unit. Therefore, the fitting of the plug-in connectors 22 into the plug-in connectors 13 is started without causing warping of the printed board 20.

Figure 16:
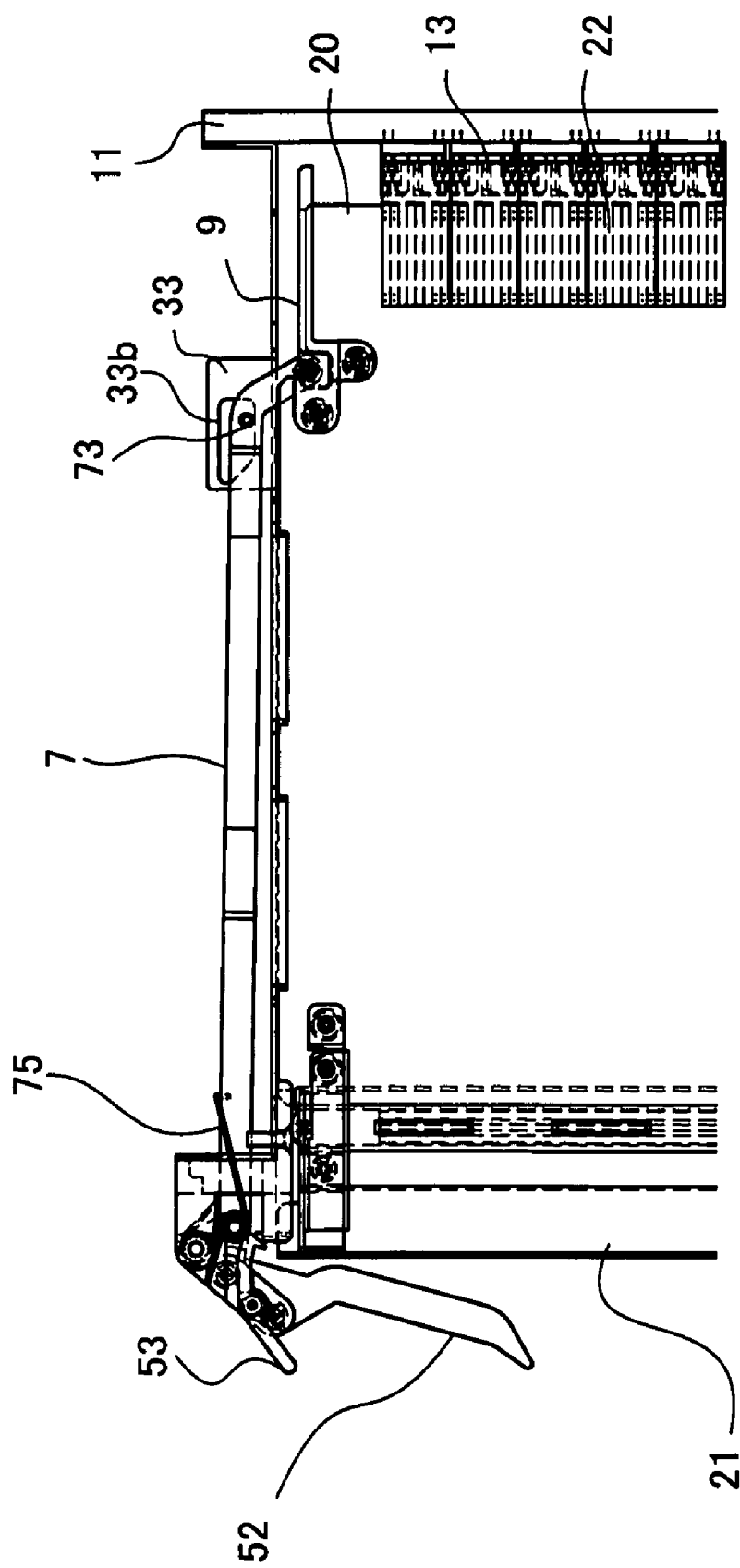
FIG. 16 is a view useful in explaining a fifth stage of the plugging-in operation.
Figure 17:
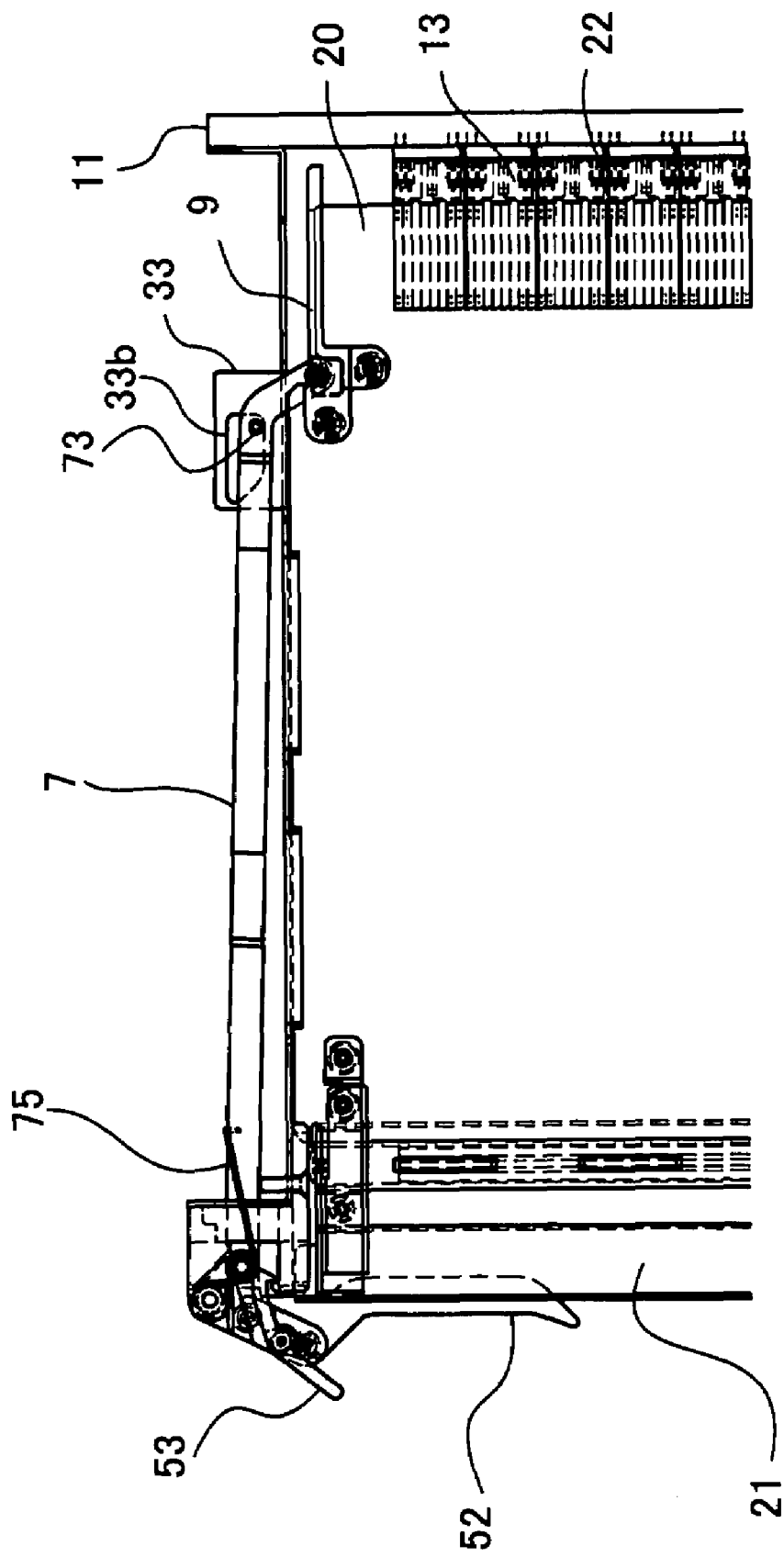
FIG. 17 is a view useful in explaining the plug-in unit connected to a backplane of the electronic apparatus.

FIGS. 16 and 17 show a state immediately before completion of the plugging-in operation for the plug-in unit and a state where the insertion operation is completed, respectively. The card lever 5 is locked by the lock lever 53.

Figure 18:
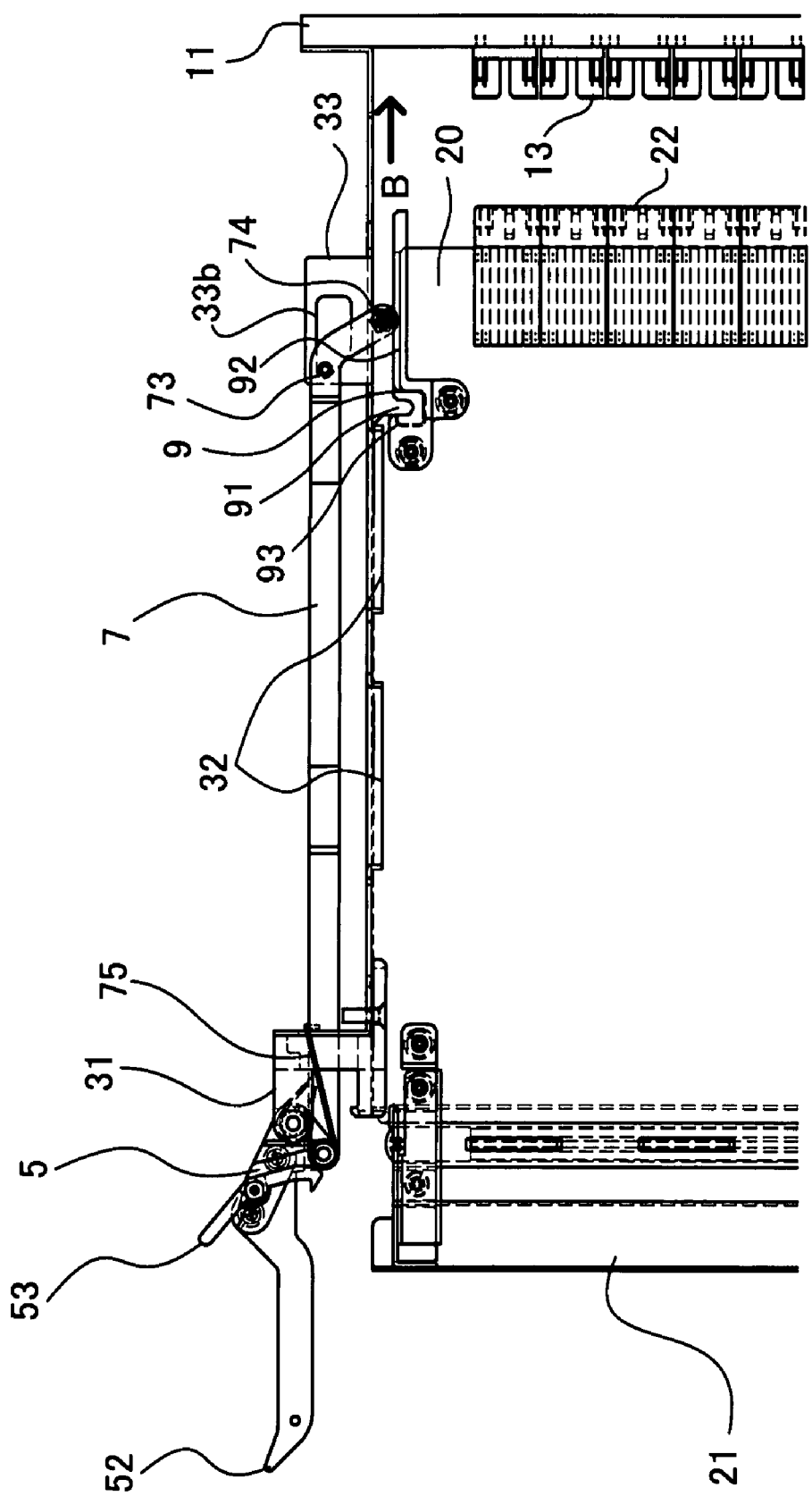
FIG. 18 is a view useful in explaining an operation for avoiding an erroneous operation during the process for plugging in a plug-in unit.

FIG. 18 is a view useful in explaining an operation for avoiding an erroneous operation during the process for plugging in a plug-in unit. Although this description is given of an upper set of component elements of the PIU plug-in/plug-off mechanism having the vertically symmetrical construction, it is to be understood that the same description is applicable to a lower set of component elements thereof.

It is now assumed that a plugging-in operation is performed by the arms 6 and 7 in a state where the printed board 20 is not fully inserted in the shelf 1. In this case, even if the card lever 5 is operated in a state where the push pin 74 is not engaged in the open recess 91 of the engaging member 9, since the guide pin 73 for guiding the free end of the arm 7 is guided into the spaces in the respective guide grooves 33b, each of which functions as a retreat passage, the push pin 74 is only moved in a direction indicated by an arrow B in FIG. 18, and hence a vertical pressing force is not applied to the printed board 20. Therefore, even if the card lever 5 is erroneously operated, the push pin 74 does not either push the printed board 20 in the insertion direction or damage the printed board 20.

According to the PIU plug-in/plug-off mechanism for an electronic apparatus, of the present invention, it is possible to suppress bending of a printed board to thereby enhance reliability in bonding of surface mount components, such as a BGR (Ball Grid Array). Further, it is possible to provide a degree of freedom to arrangement of components on a printed board by forming a square hole in the center of the printed board.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A PIU plug-in/plug-off mechanism for an electronic apparatus, which enables a printed board to be plugged into and out of a bookshelf-type electronic apparatus, comprising:
   a shelf having a rear side having a backplane on which the printed board is mounted, and sidewalls each having an upper edge which defines a front face;
   a card lever that is supported on the front face of said shelf and is turned for plugging in/out the printed board;
   an arm that has a base part at one end connected to said card lever and a free end at the other end formed to extend toward said backplane of said shelf; and
   an engaging member that is provided at a leading end of the printed board such that said engaging member is engaged with said free end of said arm in a state where the printed board is inserted in said shelf,
   wherein when said card lever is turned in one direction, said free end of said arm is brought into engagement with said engaging member; when said card lever is further turned, the printed board is pushed toward said backplane within said shelf by said free end of said arm via said engaging member; and when said card lever is turned in another direction, the printed board is pushed away from said backplane within said shelf by said free end of said arm via said engaging member.

2. The PIU plug-in/plug-off mechanism according to claim 1, wherein said card lever comprises a first resilient member for applying a turning force in the other direction, and
   wherein during insertion of the printed board from the front face of said shelf, or removed of the printed board, said card lever is held in parallel with said arm.

3. The PIU plug-in/plug-off mechanism according to claim 1, wherein said engaging member has an open recess formed to have a predetermined depth for engagement with said free end of said arm, and
   wherein when said card lever is further turned in the other direction in a state in which the printed board is plugged off a connector on said backplane, said free end of said arm is disengaged from the open recess.

4. The PIU plug-in/plug-off mechanism according to claim 3, wherein said arm comprises a guide pin that is guided by a guide groove formed at a location close to said backplane of said shelf, and a push pin for engagement in the open recess, both provided in said free end thereof and wherein when said arm is pressed in a direction in which said arm extends, said push pin is guided to a bottom part of the open recess.

5. The PIU plug-in/plug-off mechanism according to claim 4, wherein said engaging member is configured such that when a force acting in a direction away from said backplane is applied to the printed board, said push pin is brought into abutment with a front edge of the open recess.

6. The PIU plug-in/plug-off mechanism according to claim 4, wherein the guide groove comprises a retreat passage for causing said guide pin to retreat therethrough, and wherein when said card lever is turned in the one direction after insertion of the printed board into said shelf and before engagement of said engaging member with said push pin, said guide pin is guided into the retreat passage.

7. The PIU plug-in/plug-off mechanism according to claim 4, wherein said arm comprises a second resilient member for generating a turning force in a direction of pushing said free end of said arm into the open recess, and wherein said push pin is pushed against said engaging member in a state of the printed board having been inserted in said shelf.

8. The PIU plug-in/plug-off mechanism according to claim 1, wherein said card lever comprises a lock lever for locking an operating handle thereof in a disabled state, and wherein when said card lever is turned until the printed board is plugged into the connector on said backplane, said lock lever is brought into a locking state.

9. The PIU plug-in/plug-off mechanism according to claim 8, wherein when said card lever is turned through a predetermined angle in the one direction, said lock lever is brought into engagement with a lock receiving part formed in a holder of said card lever, to thereby lock turning of said card lever.

\* \* \* \* \*